(12) United States Patent
Vanderwees et al.

(10) Patent No.: US 11,740,028 B2
(45) Date of Patent: Aug. 29, 2023

(54) TWO-PASS HEAT EXCHANGER WITH CALIBRATED BYPASS

(71) Applicant: DANA CANADA CORPORATION, Oakville (CA)

(72) Inventors: Doug Vanderwees, Mississauga (CA); Kenneth M. A. Abels, Oakville (CA)

(73) Assignee: Dana Canada Corporation, Oakville (CA)

( * ) Notice: Subject to any disclaimer, the term of this patent is extended or adjusted under 35 U.S.C. 154(b) by 0 days.

(21) Appl. No.: 17/351,788

(22) Filed: Jun. 18, 2021

(65) Prior Publication Data

US 2022/0404100 A1   Dec. 22, 2022

(51) Int. Cl.
  *F28D 9/00*    (2006.01)
  *F28F 3/02*    (2006.01)
  *H01L 23/473*  (2006.01)

(52) U.S. Cl.
  CPC ............ *F28D 9/0075* (2013.01); *F28F 3/025* (2013.01); *H01L 23/473* (2013.01); *F28F 2250/06* (2013.01)

(58) Field of Classification Search
  CPC .... F28D 9/0075; F28D 9/0081; F28D 1/0325; F28D 1/0333; H01L 23/473; F28F 2250/06
  See application file for complete search history.

(56) References Cited

U.S. PATENT DOCUMENTS

| | | | | |
|---|---|---|---|---|
| 3,524,497 A | * | 8/1970 | Chu | ....................... H01L 23/473 174/15.1 |
| 5,005,640 A | * | 4/1991 | Lapinski | ................... F28D 9/00 165/142 |
| 5,062,477 A | * | 11/1991 | Kadle | ................... F28D 1/0341 165/174 |
| RE35,890 E | | 9/1998 | So | |
| 6,273,183 B1 | | 8/2001 | So | |
| 9,955,613 B2 | * | 4/2018 | Harkins | ............. H05K 7/20927 |
| 10,475,724 B2 | | 11/2019 | Maehler et al. | |
| 10,601,093 B2 | | 3/2020 | Vanderwees et al. | |

(Continued)

OTHER PUBLICATIONS

Unpublished U.S. Appl. No. 17/073,910, filed Oct. 19, 2020 entitled "High Performance Heat Exchanger With Calibrated Bypass", 60 Pages Oct. 19, 2020.

*Primary Examiner* — Tho V Duong
*Assistant Examiner* — For K Ling
(74) *Attorney, Agent, or Firm* — Ridout & Maybee LLP

(57) ABSTRACT

A two-pass heat exchanger with calibrated bypass is disclosed for cooling heat-generating substrates and/or for heating a heat transfer fluid. The heat exchanger has first and second outer plate walls and an intermediate plate wall located between and spaced from the outer plate walls in the thickness dimension of the heat exchanger, and with inlet and outlet ports at the same end. An input flow passage is defined between the first outer plate wall and the intermediate plate wall, and a return flow passage is defined between the second outer plate wall and the intermediate plate wall. The first and second fluid flow passages are in a U-flow, stacked arrangement. At least one bypass opening extends through the intermediate plate wall between the input and return flow passages, and configured to permit a portion of the heat transfer fluid to bypass portions of the input and return flow passages.

18 Claims, 14 Drawing Sheets

(56) References Cited

U.S. PATENT DOCUMENTS

| | | | |
|---|---|---|---|
| 2006/0266501 A1* | 11/2006 | So | F28D 1/0461 165/140 |
| 2007/0119574 A1* | 5/2007 | Olesen | H01L 23/473 257/E23.098 |
| 2007/0163765 A1* | 7/2007 | Rondier | H05K 7/20872 257/E23.098 |
| 2008/0279239 A1* | 11/2008 | Kan | H01S 5/02423 257/E23.098 |
| 2009/0080159 A1* | 3/2009 | Ippoushi | H01L 23/473 361/702 |
| 2009/0107655 A1* | 4/2009 | Kajiura | H01L 23/473 165/80.3 |
| 2010/0315780 A1* | 12/2010 | Murakami | H01L 23/473 361/699 |
| 2012/0267074 A1* | 10/2012 | Nishi | H01L 23/473 165/104.19 |
| 2013/0068434 A1* | 3/2013 | Takano | F28F 3/027 165/170 |
| 2014/0190669 A1* | 7/2014 | Hoshino | H01L 23/473 165/104.19 |
| 2017/0280589 A1* | 9/2017 | Tochiyama | H01L 23/473 |
| 2018/0038651 A1* | 2/2018 | Tonellato | F28F 9/0256 |
| 2019/0277578 A1 | 9/2019 | Bardeleben et al. | |
| 2021/0025655 A1 | 1/2021 | Vakilimoghaddam et al. | |

* cited by examiner

TWO-PASS HEAT EXCHANGER WITH CALIBRATED BYPASS

FIELD

The present disclosure relates to heat exchangers for cooling heat-generating substrates and/or for heating a heat transfer fluid, for example for uniform cooling of one or more heat-generating substrates arranged along a fluid flow path of the heat exchanger in which the heat transfer fluid makes two passes through the heat exchanger.

BACKGROUND

Heat exchangers comprising one or more flat cooling plates are known for cooling heat-generating substrates for vehicles. For example, in electric and hybrid electric vehicles, cooling plates are used for cooling battery cells and power electronics devices. The heat energy generated by these heat-generating substrates must be dissipated to prevent them from overheating, becoming damaged, and/or having impaired performance.

A cooling plate typically comprises one or more internal fluid flow passages oriented along a fluid flow path between an inlet port and an outlet port. One or more heat-generating substrates are arranged in thermal contact with one or both of the opposed outer surfaces of the cooling plate, and heat generated by the heat-generating substrates is transferred to the heat transfer fluid as it is circulated from the inlet port to the outlet port. The temperature of the heat transfer fluid is therefore lower at the inlet than at the outlet and, as a result, the temperature of the heat-generating substrate(s) closest to the outlet port may be higher than that of the heat-generating substrate(s) closest to the inlet port. The magnitude of this temperature differential is a limiting factor on performance of the heat exchanger.

In heat exchanger design, heat transfer performance is balanced with pressure drop. For example, providing cooling fins, turbulizers or other enhancements into the coolant flow passages may improve heat transfer performance, but may also increase pressure drop. There is a need for two-pass heat exchangers which provide improved thermal performance and/or reduced pressure drop, without significantly increasing cost or complexity of the heat exchanger.

SUMMARY

In an embodiment, a heat exchanger has a first end and a second end spaced apart along a longitudinal axis. The heat exchanger comprises a first outer plate wall; a second outer plate wall; an intermediate plate wall located between the first and second outer plate walls and spaced therefrom along a thickness dimension of the heat exchanger.

The heat exchanger further comprises a first fluid flow passage for flow of a heat transfer fluid between the first outer plate wall and the intermediate plate wall; and a second fluid flow passage for flow of a heat transfer fluid between the second outer plate wall and the intermediate plate wall. The first and second fluid flow passages are arranged in stacked relation to one another along the thickness dimension.

The heat exchanger further comprises an inlet port configured for inputting the heat transfer fluid into the first fluid flow passage; and an outlet port configured for discharging the heat transfer fluid from the second fluid flow passage.

The inlet and outlet ports are both located proximate to the first end of the heat exchanger, and are spaced apart along a transverse axis.

The heat exchanger further comprises one or more manifold openings proximate to the second end of the heat exchanger, wherein the one or more manifold openings are configured to permit the heat transfer fluid to flow between the first and second fluid flow passages proximate to the second end.

The heat exchanger further comprises at least one bypass opening extending through the intermediate plate wall between the first end of the heat exchanger and the at least one manifold opening, and configured to permit a portion of the heat transfer fluid to bypass portions of the first and second fluid flow passages.

In an aspect, the heat exchanger further comprises at least one cooling zone, wherein each cooling zone is defined inside one of the first and second fluid flow passages, and is configured to receive heat transferred through one of the first and second outer plate walls from one or more heat-generating substrates outside the heat exchanger.

In an aspect, each of the at least one cooling zones corresponds at least approximately in shape and area to one of the heat-generating substrates.

In an aspect, each of the at least one cooling zones includes one or more channel elements configured to provide a conduit for heat transfer from an outer plate wall to the heat transfer fluid, create turbulence in the heat transfer fluid, and/or to provide structural support for the first or second fluid flow passage.

In an aspect, the one or more channel elements in at least one of the cooling zones comprises a corrugated fin sheet which is in contact with the intermediate plate wall and one of the first and second outer plate walls.

In an aspect, the one or more channel elements in at least one of the cooling zones comprises one or more protrusions, each protrusion comprising a rib or dimple extending into one of the fluid flow passages from the intermediate plate wall or one of the outer plate walls.

In an aspect, a plurality of the cooling zones are spaced apart along a continuous fluid flow path extending from the inlet port to the outlet port and including the first and second fluid flow passages. In an aspect, each of the cooling zones has an upstream end adapted for receiving heat transfer fluid flowing along the fluid flow path, and an opposite downstream end adapted for discharging the heat transfer fluid along the fluid flow path. In an aspect, the heat exchanger further comprises a plurality of manifold spaces, including at least one intermediate manifold space, each manifold space being defined between an upstream end of one cooling zone and a downstream end of an immediately adjacent to the cooling zone. In an aspect, at least one bypass opening is located at one of the intermediate manifold spaces.

In an aspect, a plurality of the bypass openings are located at one or more of the intermediate manifold spaces, and are spaced apart along a transverse axis.

In an aspect, one or more of the bypass openings is located within one of the cooling zones.

In an aspect, the one or more bypass openings in one of the cooling zones is partly obstructed by a channel element in the cooling zone, wherein the channel element comprises a corrugated fin sheet.

In an aspect, one or more of the bypass openings is located proximate to the inlet port and the outlet port to permit a direct conduit for fluid flow from the first fluid flow passage to the second fluid flow passage, without passing through any of the cooling zones.

In an aspect, the plurality of cooling zones is located in the second fluid flow passage.

In an aspect, the first fluid flow passage includes one or more channel elements, each comprising a support element in contact with the intermediate plate wall and the first outer plate wall. In an aspect, each support element has opposite ends which are spaced apart along the longitudinal axis.

In an aspect, the heat exchanger further comprises apertures at the opposite ends of at least one support element, such that the support element defines an open-ended flow channel in the first fluid flow passage.

In an aspect, one or more of the bypass openings is provided inside one of the open-ended flow channels, such that a portion of the heat transfer fluid flowing through the open-ended flow channel is diverted to the second fluid flow passage.

In an aspect, the intermediate plate wall is a composite wall structure comprising substantially flat central portions of first and second embossed plates which are laminated together face-to-face.

In an aspect, the flat central portion of each of the first and second embossed plates is surrounded by an upstanding sidewall which terminates in an outwardly extending, planar, peripheral sealing flange which is sealed to an internal surface of one of the outer plate walls along an outer perimeter of the embossed plate.

In an aspect, at least one bypass opening comprises aligned apertures in the flat central portions of the first and second embossed plates.

In an aspect, the first and second outer plate walls comprise substantially flat plates which are parallel and spaced apart along the thickness dimension of the heat exchanger. In an aspect, the first and second outer plate walls are thicker than the first and second embossed plates. In an aspect, at least one of the outer plate walls has an external surface which is sufficiently flat to maintain intimate contact with a flat surface of a heat-generating substrate.

In an aspect, the inlet and outlet ports are both provided in the first outer plate wall.

BRIEF DESCRIPTION OF DRAWINGS

The invention will now be described, by way of example only, with reference to the accompanying drawings in which.

DETAILED DESCRIPTION

Figure 1:
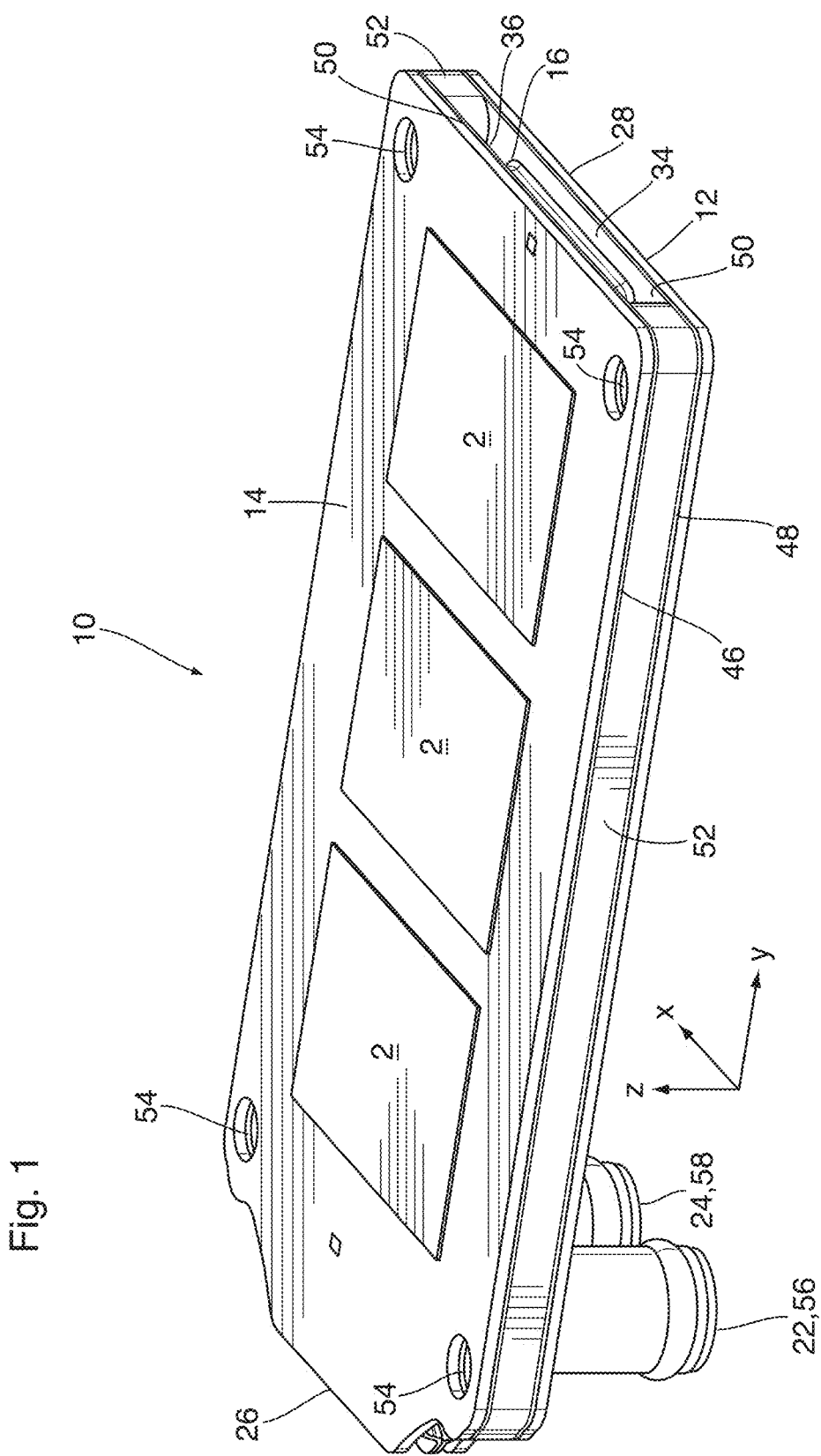
FIG. 1 is a first perspective view of a heat exchanger according to an embodiment.

The example embodiments described herein relate to heat exchangers for transferring heat from one or more heat-generating substrates located outside the heat exchanger to a liquid heat transfer fluid flowing through one or more fluid flow passages inside the heat exchanger. In some embodiments, the heat exchangers described herein may be used for cooling one or more heat-generating substrates, such as power electronics substrates for battery or hybrid electric vehicles. These power electronics substrates may include transistors, resistors, capacitors, field effect transistors (FETS), isolated gate bipolar transistors (IGBTs), power inverters, DC to DC converters, DC to AC converters, or combinations thereof. However, the heat exchangers described herein may be used for cooling other heat-generating substrates in conventional or electric vehicles, such as battery cells.

In other embodiments the heat exchangers described herein may be used for generating a heated fluid stream, with the one or more heat-generating substrates comprising one or more electric heaters. Such fluid heating devices may be incorporated into active warm-up systems for conventional or electric vehicles.

In terms of general structure, a heat exchanger 10 described herein comprises first and second outer plate walls 12, 14 and an intermediate plate wall 16, wherein the intermediate plate wall 16 is sandwiched between the outer plate walls 12, 14 and spaced therefrom along a thickness dimension (z-axis) of heat exchanger 10. The first and second outer plate walls 12, 14 have internal and external surfaces, wherein the internal surfaces of the first and second outer plate walls 12, 14 face toward each other. The spaces between the intermediate plate wall 16 and the internal surfaces of the outer plate walls 12, 14 define first and second fluid flow passages 18, 20 for flow of a heat transfer fluid, the fluid flow passages 18, 20 being arranged in stacked relation to one another (along z-axis), as shown in FIGS. 7 and 8.

Heat exchanger 10 includes an inlet port 22 and an outlet port 24, both of which are located proximate to a first end 26 of heat exchanger 10. The inlet port 22 and outlet port 24 are each in fluid communication with one of the fluid flow passages 18, 20. As shown in FIG. 8, the inlet port 22 is in fluid communication with the first fluid flow passage 18, which is defined between the intermediate plate wall 16 and the first outer plate wall 12. The inlet port 22 is configured for inputting heat transfer fluid into the first fluid flow passage 18, and the first fluid flow passage 18 is configured to receive heat transfer fluid directly from the inlet port 22. Therefore, the first fluid flow passage 18 is also referred to herein as the "input flow passage".

Figure 7:
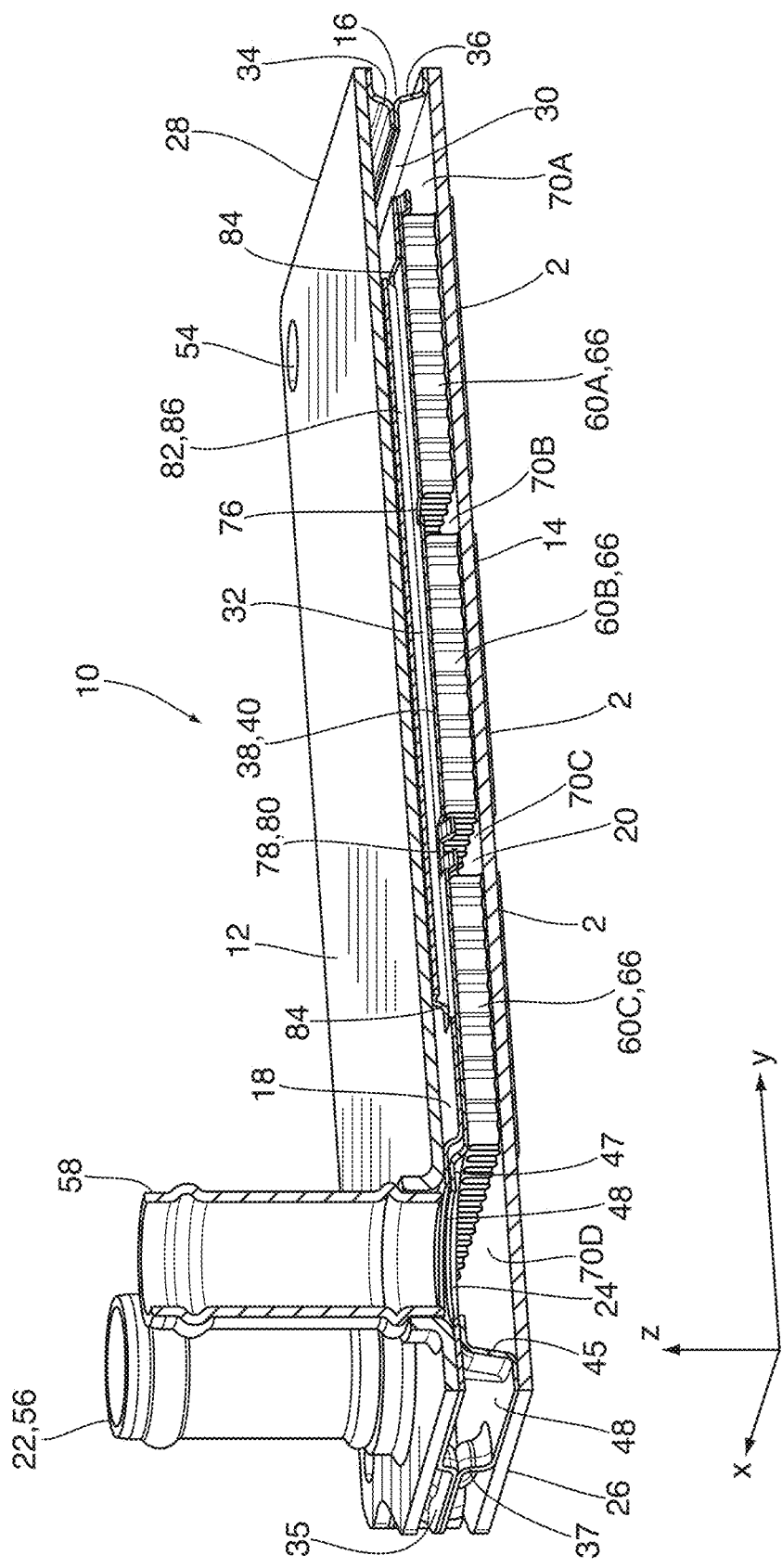
FIG. 7 is a longitudinal cross-section along line 7-7' of FIG. 2.
Figure 8:
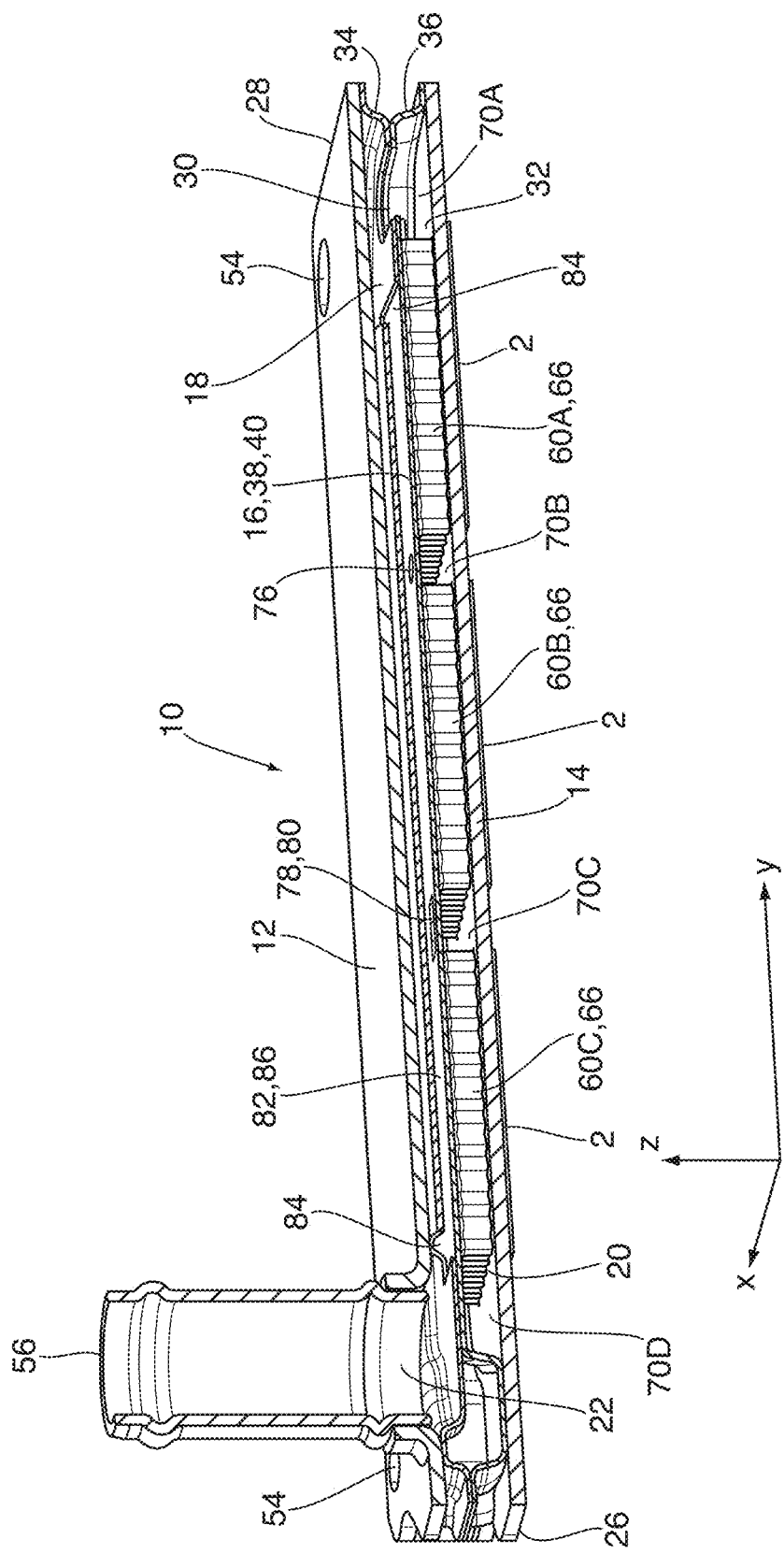
FIG. 8 is a longitudinal cross-section along line 8-8' of FIG. 2.

Similarly, as shown in FIG. 7, the outlet port 24 is in fluid communication with the second fluid flow passage 20, which is defined between the intermediate plate wall 16 and the second outer plate wall 14. The outlet port 24 is configured for discharging the heat transfer fluid from the second fluid flow passage 20. The second fluid flow passage 20 is configured to return the heat transfer fluid directly to the outlet port 24, and is also referred to herein as the "return flow passage".

Both fluid flow passages 18, 20 extend between the first end 26 of heat exchanger 10 and an opposite second end 28 thereof, the first and second ends 26, 28 being spaced apart along the y-axis. One or more manifold openings 30 are provided at or proximate to the second end 28, the one or more manifold openings 30 extending through or around the intermediate plate wall 16. The one or more manifold openings 30 permit the heat transfer fluid to flow from the input flow passage 18 to the return flow passage 20 at or proximate to the second end 28 of heat exchanger 10. Thus, a continuous flow path 32 (FIGS. 7 and 8) is defined from the inlet port 22 to the outlet port 24, extending through the input flow passage 18, manifold opening(s) 30 and the return flow passage 20.

In the present embodiment, there is a single manifold opening 30 in the form of a slot of constant width (along y-axis), and having a length (along x-axis) extending transversely across substantially the entire widths of the fluid flow passages 18, 20. However, the one or more manifold openings 30 may instead comprise a single opening of variable length and/or width, or a plurality of discrete openings of the same or different area, spaced apart along the transverse dimension of heat exchanger 10.

Because the fluid flow path 32 extends from the first end 26 to the second end 28 of the heat exchanger 10, and back again to the first end 26, the heat transfer fluid effectively makes two passes along the length (y-axis) of the heat exchanger 10 as it circulates from the inlet port 22 to the outlet port 24. Therefore, the heat exchanger 10 is an example of a "two-pass" heat exchanger.

Furthermore, the heat transfer fluid flows in opposite directions through the fluid flow passages 18, 20, and therefore the fluid flow passages 18, 20 are in a "U-flow" arrangement. In this regard, the direction of fluid flow in the input flow passage 18 is from the first end 26 to the second end 28, and the direction of fluid flow in the return passage 20 is from the second end 28 to the first end 26. However, it will be appreciated that the direction of fluid flow in each fluid flow passage 18, 20 may be reversed, with the ports 24 and 22 being the inlet and outlet, respectively.

Figure 4:
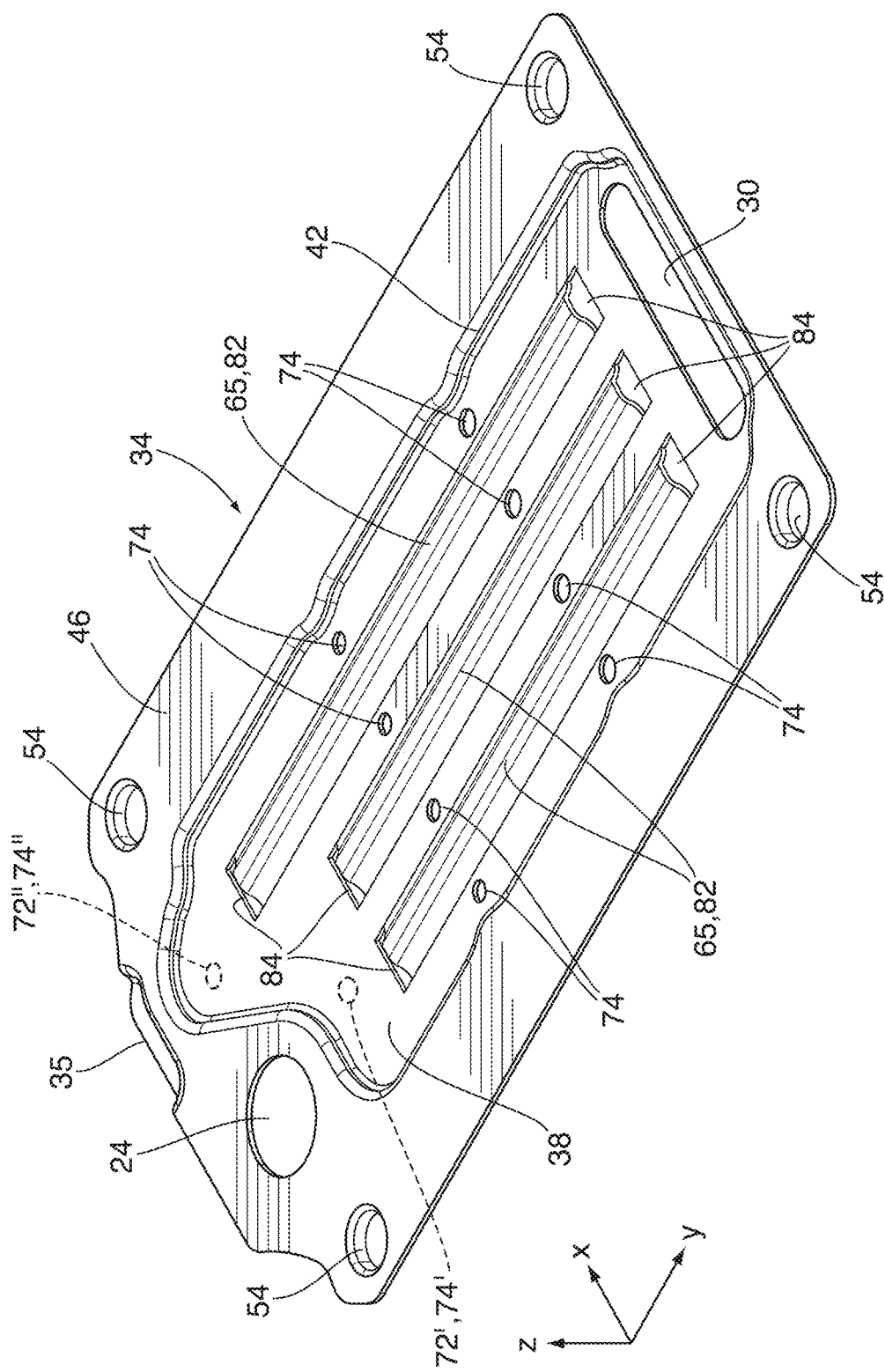
FIG. 4 is an enlarged perspective view of the first embossed plate, with the same orientation as in FIG. 3.
Figure 5:
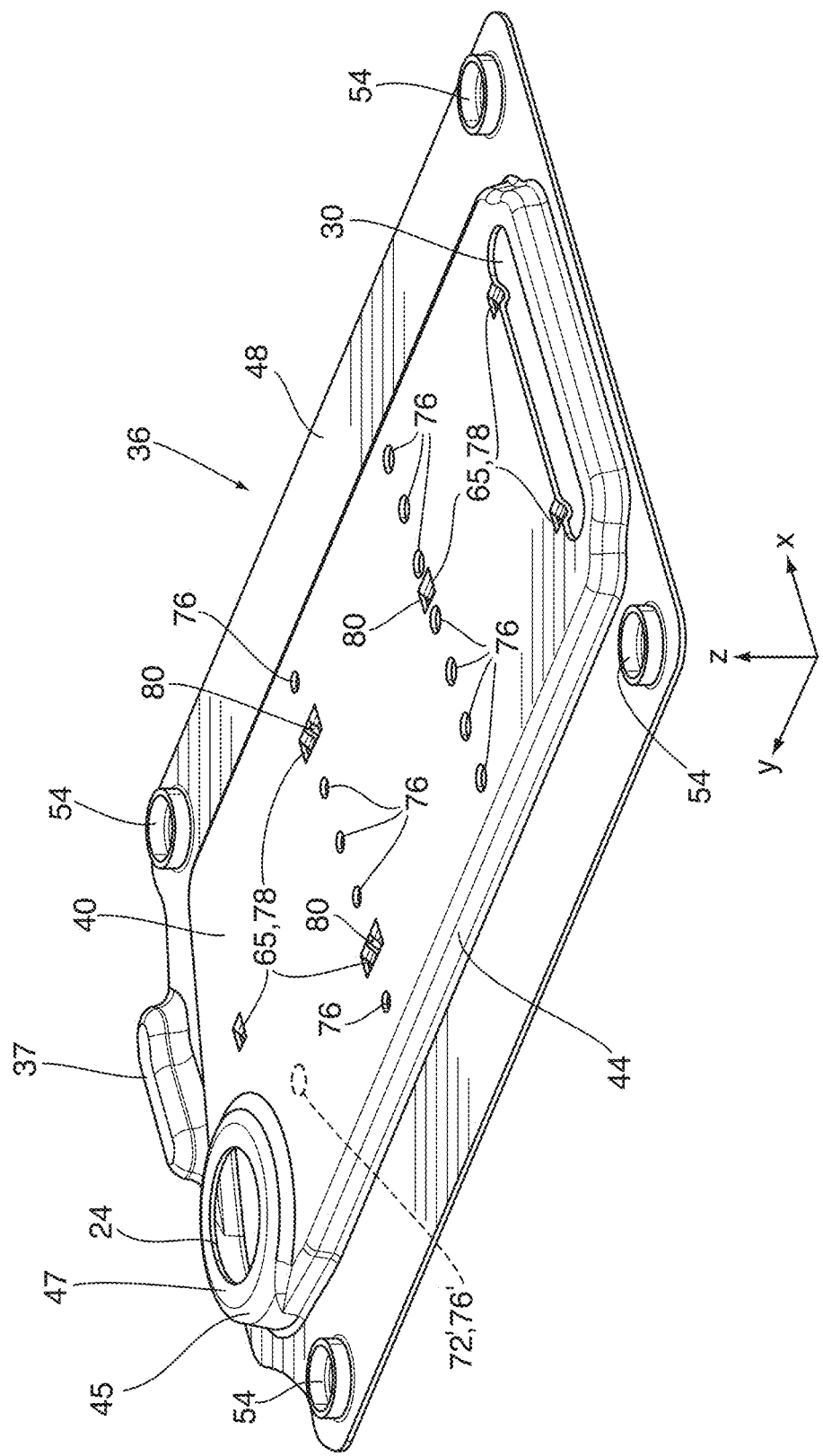
FIG. 5 is a perspective view of the second embossed plate, with the same orientation as in FIG. 3.
Figure 6:
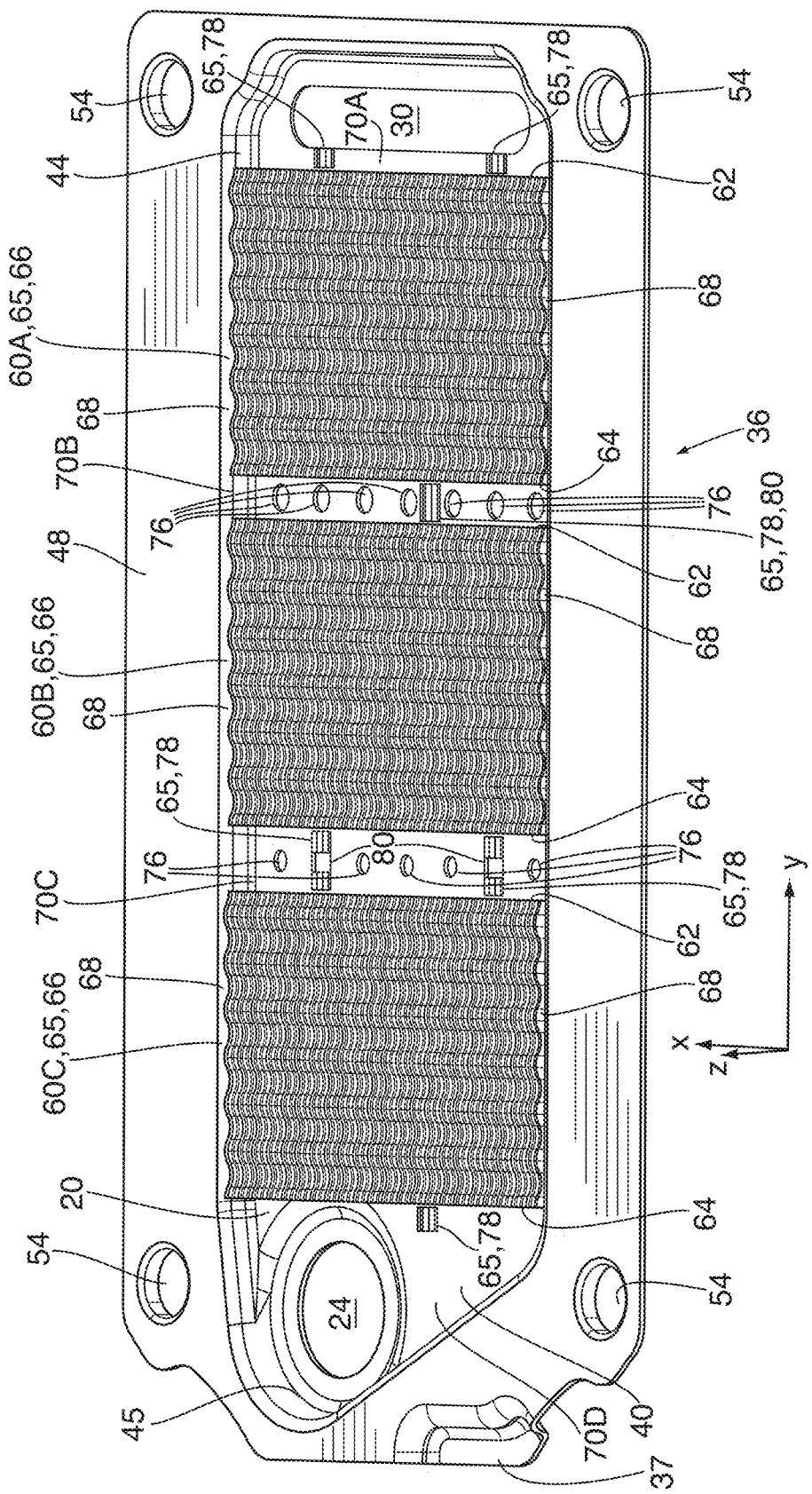
FIG. 6 is a perspective view of the opposite side of the second embossed plate, having a plurality of corrugated fin sheets arranged on its flat central portion.

In the present embodiment, the first and second outer plate walls 12, 14 comprise substantially flat plates which are parallel, spaced apart along the z-axis, and may have the same size and shape. The intermediate plate wall 16 is a composite plate structure comprising the substantially flat central portions 38, 40 of first and second embossed plates 34, 36, which are laminated together face-to-face. Enlarged views of the individual embossed plates 34, 36 are shown in FIGS. 4-6. The central portions 38, 40 are surrounded by upstanding sidewalls 42, 44 which enclose the sides (along y-axis) and ends (along x-axis) of the fluid flow passages 18, 20. The tops of the upstanding sidewalls 42, 44 are spaced from the central portions 38, 40 along the z-axis and terminate in outwardly extending, planar, peripheral sealing flanges 46, 48 which are sealed to the internal surfaces of respective outer plate walls 12, 14 along the outer perimeters of the embossed plates 34, 36.

In the present embodiment, the outer plate walls 12, 14 and the embossed plates 34, 36 have substantially the same outer peripheral area. However, due to the presence of peripheral sealing flanges 46, 48, the area of the intermediate plate wall 16 comprising laminated central portions 38, 40 is less than that of each of the outer plate walls 12, 14. Therefore, there are gaps 50 between the peripheral sealing flanges 46, 48 along the sides (y-axis) and ends (x-axis) of the heat exchanger 10, these gaps 50 being outside the fluid flow passages 18, 20.

Figure 9:
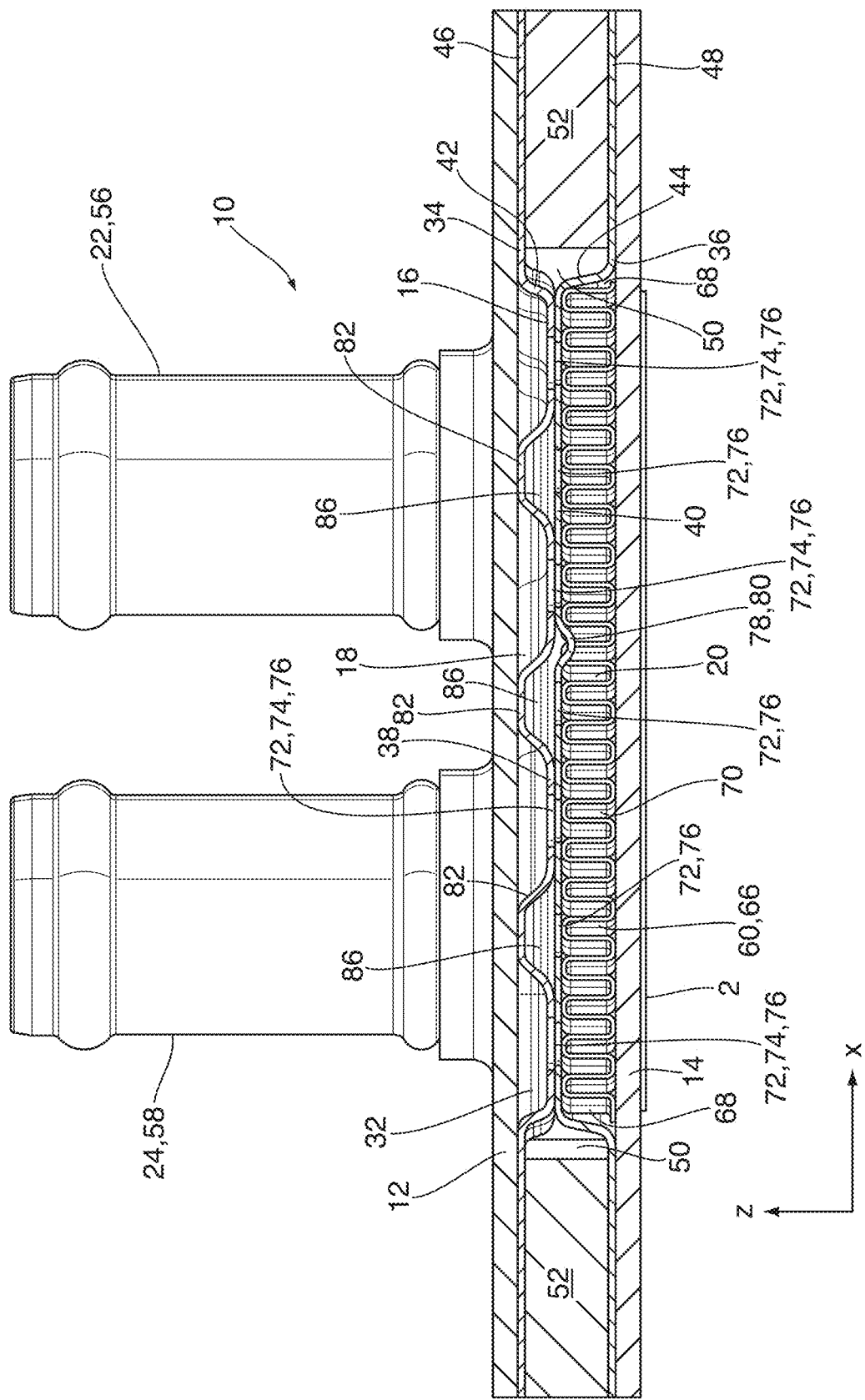
FIG. 9 is a transverse cross-section along line 9-9' of FIG. 2.

Each of the gaps 50 along the opposite sides of the heat exchanger 10 may be filled with a longitudinal spacer block 52 extending lengthwise between the first and second ends 26, 28, and having sufficient height (along z-axis) to engage and substantially fill the gap 50 between the peripheral sealing flanges 46, 48 along the sides of the heat exchanger 10. As shown in FIG. 9, each spacer block 52 has sufficient width (along x-axis) to substantially fill a transverse space between the outer peripheral edges of the outer plate walls 12, 14 (and/or sealing flanges 46, 48) and the upstanding sidewalls 42, 44 of embossed plates 34, 36. The spacer blocks 52 provide structural support along the edges of the heat exchanger 10, and also provide a convenient area for placement of mounting holes 54, which extend through the outer plate walls 12, 14, sealing flanges 46, 48 and spacer blocks 52.

The embossed plates 34, 36 also include embossed ribs 35, 37 which are located at the first end 26 of heat exchanger. The embossed ribs 35, 37 have top surfaces which are co-planar with the flat central portions 40, 42 of embossed plates 34, 36, and which engage one another as shown in FIG. 7 to provide structural support at the first end 26 of heat exchanger 10.

It will be appreciated that spacer blocks 52 and/or embossed ribs 35, 37 are not required in all embodiments, and that mounting holes 54 are not necessarily required along the edges of the heat exchanger 10 in all embodiments. For example, in some embodiments, the outer edges of the fluid flow passages 18, 20 may be closer to the outer peripheral edges of the outer plate walls 12, 14, such that additional support may not be required along the outer edges of the heat exchanger 10.

Figure 2:
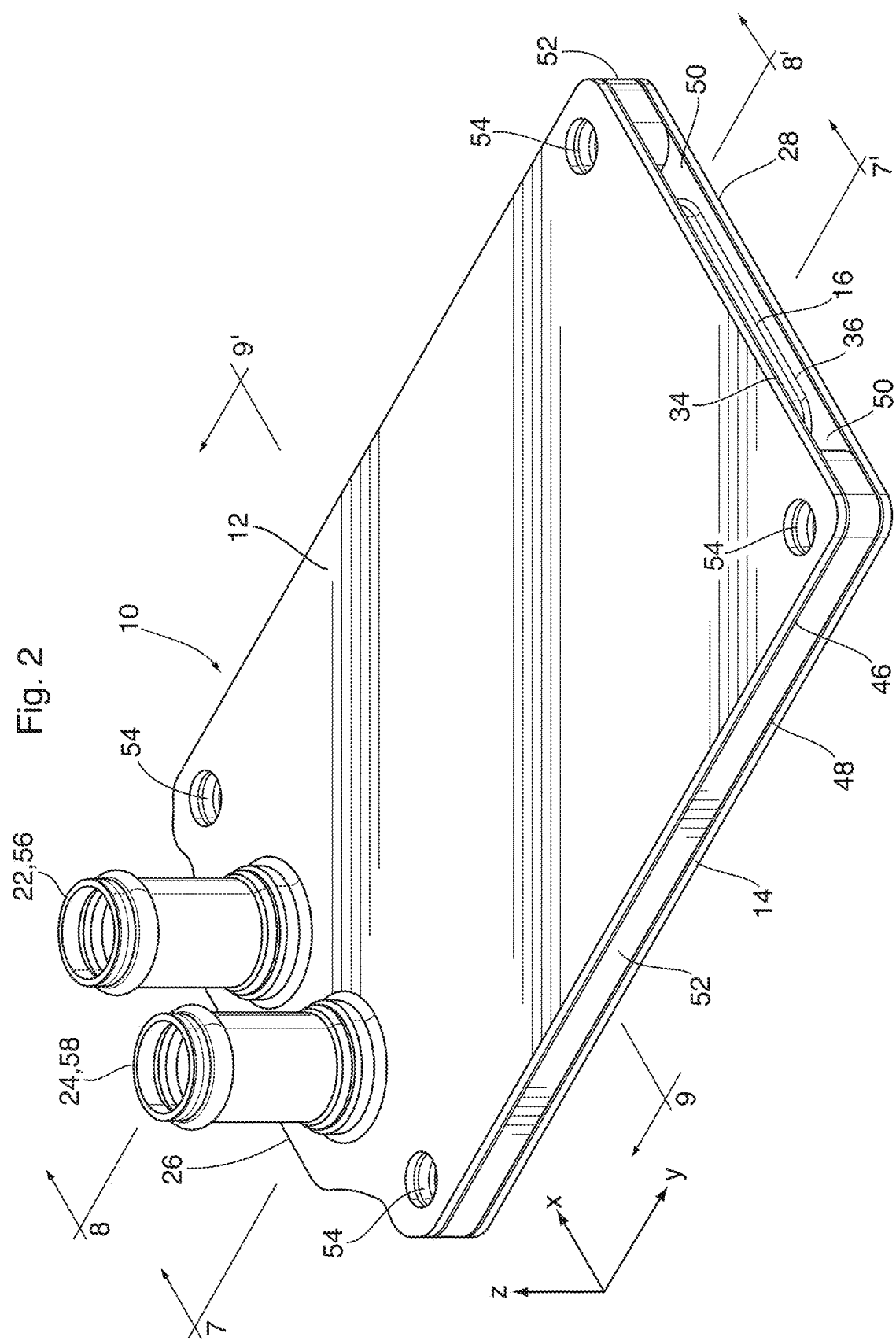
FIG. 2 is a second perspective view of the heat exchanger of FIG. 1, from the opposite side.

One or more heat-generating substrates 2 may be directly mounted on the external surface of one or both of the outer plate walls 12, 14. The drawings only show the rectangular outlines of the heat-generating substrates 2. The structural details of substrates 2 have been omitted for reasons of convenience, and are unnecessary for the description of heat exchanger 10. As shown in FIG. 1, heat exchanger 10 has three heat-generating substrates 2 of substantially equal area provided along the second outer plate wall 14. As shown in FIG. 2, there are no heat-generating substrates along the external surface of the first outer plate wall 12. However, the number, size, location and cooling requirements of the heat-generating substrates 2 is variable. For example, in other embodiments, heat-generating substrates 2 may be provided only along the first outer plate wall 12, or one or more heat-generating substrates 2 may be provided along both outer plate walls 12, 14. As shown in FIG. 1, the heat-generating substrates 2 are spaced apart along the y-axis. In addition, the widths of the heat-generating substrates 2 along the x-axis are substantially the same as the widths of the fluid flow passages 18, 20.

In order to maximize intimate contact with the heat-generating substrates 2, one or both outer plate walls 12, 14 require a relatively high degree of flatness, at least along its external surface, and are therefore typically thicker than the embossed plates 34, 36. The outer plate walls 12, 14 and the embossed plates 34, 36 may comprise aluminum alloys and may joined together by brazing. As can be seen in the cross-sections of FIGS. 7 to 9, the outer plate walls 12, 14 are thicker than embossed plates 34, 36.

In addition, both the inlet port and the outlet port 22, 24 of heat exchanger 10 are provided through the first outer plate wall 12, and are spaced transversely (along x-axis) from one another. Thus, the second outer plate wall 14 is free of perforations and obstructions to maximize the area available for heat exchange with the heat-generating substrates 2. However, this arrangement is not essential. In some embodiments, each of the outer plate walls 12, 14 may include one of the ports 22, 24. Alternatively, both ports 22, 24 may be provided in the second outer plate wall 14.

The inlet and outlet ports 22, 24 are provided with respective inlet and outlet fittings 56, 58 for connection to conduits (not shown) of a fluid circulation system of the vehicle. The fittings 56, 58 in the present embodiment are straight tubes projecting vertically (along the z-axis) from the external surface of the first outer plate wall 12. However, the fittings 56, 58 are not necessarily straight, and it is not necessary that both fittings 56, 58 project from the first outer plate wall 12, depending on the specific application. For example, one or both ports 22, 24 and one or both fittings 56, 58 may instead be provided in/on the second outer plate wall 14. It is also possible to provide the inlet and outlet ports 22, 24 along the edges of the heat exchanger 10. For example, the inlet and outlet ports 22, 24 may both be located along the first end 26, with fittings 56, 58 comprising "side entry" fittings projecting along the y-axis from the edge of the heat exchanger 10. Examples of side-entry fittings are described in commonly assigned U.S. Pat. No. 10,475,724 entitled HEAT EXCHANGERS FOR DUAL-SIDED COOLING; and US Publication No. 2019/0277578 A1 entitled "HEAT EXCHANGERS WITH INTEGRATED ELECTRICAL HEATING ELEMENTS AND WITH MULTIPLE FLUID FLOW PASSAGES", each of which is incorporated herein by reference in its entirety.

Figure 3:
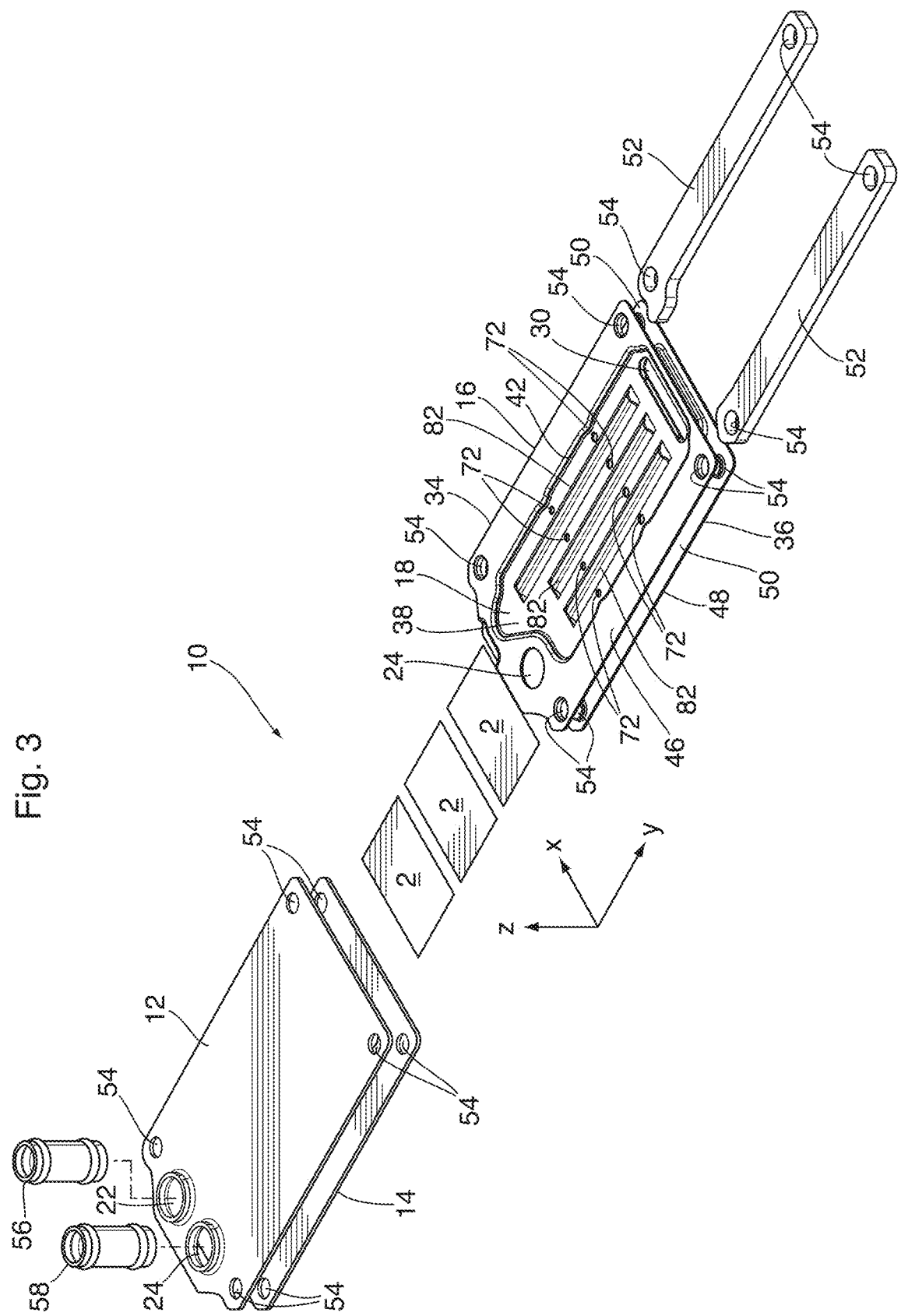
FIG. 3 is an exploded view of the heat exchanger of FIG. 1.

In the illustrated heat exchanger 10, the inlet port 22 is simply defined by a single opening through the first outer plate wall 12, since the input flow passage 18 is located between the first outer plate wall 12 and the intermediate plate wall 16. However, the outlet port 24 is defined by a plurality of aligned openings, since the return flow passage 20 is located between the intermediate plate wall 16 and the opposite second outer plate wall 14. As shown in the drawings, the outlet port 24 is defined by three aligned openings: in the first outer plate wall 12 (FIG. 3); in the peripheral flange 46 of the first embossed plate 34 (FIG. 4); and in the central portion 40 of the second embossed plate 36 (FIG. 5). In addition, as shown in FIG. 5, the opening of port 24 in the second embossed plate 36 is surrounded by a raised embossment 45 with an annular sealing surface 47. As shown in FIG. 7, the raised embossment 45 has sufficient height (z-axis) such that the annular sealing surface 47 sealingly engages the peripheral flange 46 of the first embossed plate 34, to seal the outlet port 24 from the first fluid flow passage 18.

The structure of the heat exchanger 10 described and shown herein is exemplary only, and it will be appreciated that other structures are possible. For example, instead of comprising flat plates, the outer plate walls 12, 14 may comprise the flat portions of a pair of embossed outer plates, with a single intermediate plate 16 enclosed between the embossed outer plates. Examples of such three-layer structures are described in above-mentioned U.S. Pat. No. 10,475,724; and in commonly assigned US Publication No. 2021/0025655 A1 entitled THREE-LAYER HEAT EXCHANGER WITH INTERNAL MANIFOLD FOR BATTERY THERMAL MANAGEMENT; and U.S. Pat. No. 10,601,093 entitled COUNTER-FLOW HEAT EXCHANGER FOR BATTERY THERMAL MANAGE-MENT APPLICATIONS, each of which is incorporated herein by reference in its entirety.

Having now described the general structure of the heat exchanger 10, the calibrated bypass is described below.

One or more cooling zones 60 are defined along the continuous fluid flow path 32 between the inlet and outlet ports 22, 24. Each cooling zone 60 is defined in one of the first and second fluid flow passages 18 or 20. The cooling zones 60 define specific areas in which heat may be transferred from one or more heat-generating substrates 2 outside the heat exchanger 10 to the heat transfer fluid flowing through one or both of the fluid flow passages 18, 20, inside the heat exchanger 10.

Heat exchanger 10 includes three cooling zones 60, each corresponding at least approximately in shape and area to one of the three heat-generating substrates 2, as shown in FIGS. 7-9. Because all three heat-generating substrates 2 are in thermal contact with the external surface of the second outer plate wall 14, the three cooling zones 60 are located in the return flow passage 20, i.e. between the outer plate wall 14 and intermediate plate wall 16. However, other embodiments may include one or more heat-generating substrates 2 in thermal contact with the external surface of the first outer plate wall 12, in which case the input flow passage 18 will define one or more cooling zones 60.

Where the heat exchanger 10 comprises a plurality of cooling zones, 60, the cooling zones 60 are spaced apart along the fluid flow path 32, corresponding to the spacing between the heat-generating substrates 2, and are labelled 60A, 60B and 60C in FIGS. 6-8. As shown in FIG. 6, each cooling zone 60 has an upstream end 62 and an opposite downstream end 64. The upstream end 62 is adapted for receiving the heat transfer fluid as it flows along the fluid flow path 32, and the downstream end 64 is adapted for discharging the heat transfer fluid along the fluid flow path 32. For example, the cooling zone 60A closest to the inlet port 22 receives relatively cool heat transfer fluid from the inlet port 22 (through input flow passage 18 and manifold opening 30) and discharges it to an intermediate cooling zone 60B.

The cooling zone 60C closest to the outlet port 24 receives relatively warm heat transfer fluid from intermediate cooling zone 60B and discharges it to the outlet port 24. Therefore, where the heat exchanger 10 includes multiple similar cooling zones 60 arranged in series, heat is added to the fluid as it passes through each successive cooling zone 60, such that the temperature of the heat transfer fluid increases as it flows along the fluid flow path 32 from the inlet port 22 to the outlet port 24.

One or both of the fluid flow passages 18, 20 are provided with features which are generally referred to herein and in the drawings as "channel elements 65". The channel elements 65 generally occupy at least a portion of a fluid flow passage 18, 20, extending between the intermediate plate wall 16 and a respective outer plate wall 12, 14. Each channel element 65 performs one or more functions, such as providing structural support; providing a conduit for heat transfer from an outer plate wall 12, 14 to the heat transfer fluid flowing through fluid flow passages 18, 20; creating turbulence in the heat transfer fluid to enhance heat transfer; providing bypass flow paths; and/or positioning of other channel elements, as further described below. The specific function(s) performed by any specific channel element 65 depends at least somewhat on its structure, and where it is located along the flow path 32 in relation to the heat-generating substrate(s) 2.

For example, channel elements 65 may comprise protrusions extending into one or both of the fluid flow passages 18, 20. These channel elements 65 may be integrally formed with one or more of the plate walls 12, 14, 16, or may comprise sheets or plates which are inserted into a fluid flow passage 18, 20. Such protrusions may take the form of dimples, ribs, fins or turbulizers.

In the present embodiment, each cooling zone 60 includes one or more channel elements 65, the predominant function of which is to transfer heat from the heat-generating substrate(s) 2 to the heat transfer fluid inside the flow path 32, specifically the return flow passage 20.

The channel elements 65 in the cooling zones 60 comprise one or more corrugated fin sheets 66. Each corrugated fin sheet 66 is in contact with the intermediate plate wall 16 and with the internal surface of the second outer plate wall 14, extending throughout the height (z-axis) of the return flow passage 20, and providing a continuous path for heat conduction from the external surface of the second outer plate wall 14 to the heat transfer fluid flowing through the return flow passage 20. In some embodiments, each corrugated fin sheet 66 may be metallurgically bonded to the second outer plate wall 14 and/or the intermediate plate wall 16 to enhance heat transfer. The corrugated fin sheet(s) 66 also provide enhanced heat transfer by increasing the heat transfer surface area inside the return flow passage 20, and by increasing turbulence of the heat transfer fluid. The corrugated fin sheet(s) 66 may also provide structural support for the fluid flow passages 18, 20 in which they are located.

The heat exchanger 10 is configured to minimize bypass flow between the outer longitudinal edges (along x-axis) of the cooling zones 60 and the portions of sidewalls 42, 44 extending lengthwise between the first and second ends 26, 28 of the heat exchanger 10. Such bypass flow impairs heat exchanger performance since it provides a direct path for fluid flow from the inlet port 22 to the outlet port 24, without passing through the cooling zones 60. In the present embodiment, relatively narrow bypass flow passages 68 are shown in FIG. 9 between the sidewalls 44 of second embossed plate 36 and the outer longitudinal edges of the corrugated fin sheets 66 of the cooling zones 60. It is desirable that the corrugated fin sheets 66 extend as close as possible to the sidewalls 44 to minimize bypass flow through passages 68.

As shown in FIGS. 6-8, a plurality of manifold spaces 70 are provided along the flow path 32. These manifold spaces 70 allow for fluid distribution and/or fluid mixing upstream and downstream of each of the cooling zones 60, i.e. at the upstream and downstream ends 62, 64 of at least some of the cooling zones 60. The manifold spaces are labelled alphanumerically as 70A, 70B, 70C and 70D to distinguish them from each other. Manifold space 70A is located between the inlet port 22 and the upstream end 62 of the cooling zone 60A closest thereto, also referred to herein as the "inlet manifold space". Another of the manifold spaces 70D is located between the outlet port 24 and the downstream end 64 of the cooling zone 60C closest thereto, also referred to herein as the "outlet manifold space".

The heat exchanger 10 may also include at least one intermediate manifold space 70, each located between the downstream end 64 of one cooling zone 60 and the upstream end 62 of an immediately adjacent cooling zone 60. Because heat exchanger 10 includes three cooling zones 60, there are two intermediate manifold spaces 70B, 70C in this embodiment. In a heat exchanger 10 with n cooling zones 60, there may be up to n-1 intermediate manifold spaces 70. The intermediate manifold spaces 70B, 70C in the present embodiment comprise gaps which correspond at least approximately to spaces between adjacent heat-generating substrates 2 and/or between adjacent corrugated fin sheets 66.

The manifold spaces 70 of heat exchanger 10 correspond to areas in which there is reduced heat transfer to the heat transfer fluid, and include no other channel elements 65, or may include channel elements 65 which provide less flow resistance than the corrugated fin sheets 66 in the cooling zones 60. In the present embodiment, at least the intermediate manifold spaces 70B, 70C and the outlet manifold space 70D comprise substantially empty spaces through which the heat transfer fluid may flow unimpeded.

The heat exchanger 10 further comprises at least one bypass opening 72 extending through the intermediate plate wall 16 between the input flow passage 18 and the return flow passage 20. Each bypass opening 72 is located between the first end 26 and the at least one manifold opening 30, to permit diversion of heat transfer fluid from the relatively high pressure input flow passage 18 to the relatively low pressure return flow passage 20. The at least one bypass opening 72 is configured to permit a portion of the heat transfer fluid to flow from the first fluid flow passage 18 to the second fluid flow passage 20 without passing through the at least one manifold opening 30. The portion(s) of the heat transfer fluid which flow through the at least one bypass opening 72 therefore bypass portions of the first and second fluid flow passages 18, 20, and may partially or completely bypass one or more of the cooling zones 60. In this regard, a portion of the heat transfer fluid flowing through any one of the bypass openings 72 bypasses the portion of the input flow passage 18 located between the bypass opening 72 and the at least one manifold opening 30, and also bypasses the portion of the return flow passage 20 located between the bypass opening 72 and the at least one manifold opening 30, including portions of any cooling zones 60 located between the bypass opening 72 and the at least one manifold opening 30.

In most cases, the heat transfer fluid flowing through a bypass opening 72 is relatively cool, and is injected into an area of the return flow passage 20 in which the heat transfer fluid is at a higher temperature. The locations and areas of bypass openings 72 may be selected to deliver relatively cool heat transfer fluid into hotter areas of the return flow passage 20, to improve temperature uniformity in the return flow passage 20, and throughout the external surface of the second outer plate wall 14 and the heat-generating substrates 2. Typically, the provision of bypass flow through openings 72 reduces the overall pressure drop through heat exchanger 10, since some of the fluid typically bypasses at least a portion of one or more cooling zones 60. These cooling zones 60 have relatively high pressure drop due to flow restrictions caused by the presence of the corrugated fin sheet(s) 66.

At least some of the bypass openings 72 comprise aligned apertures 74, 76 in the flat central portions 38, 40 of the first and second embossed plates 34, 36. The locations of at least one of the bypass openings 72 coincides with the location of a manifold space 70, such that one or more of the manifold spaces 70 is in direct fluid communication with the input flow passage 18 through one or more bypass openings 72. In some embodiments, a plurality of the manifold spaces 70 is in direct fluid communication with the input flow passage 18 through one or more bypass openings 72. In some embodiments, each of the intermediate manifold spaces 70B, 70C between adjacent cooling zones 60 is in direct fluid communication with the input flow passage 18 through one or more bypass openings 72.

In the present embodiment, each of the intermediate manifold spaces 70B, 70C is in direct fluid communication with the input flow passage 18 through a plurality of spaced-apart bypass openings 72 arranged in a transverse row (along x-axis). The location of each row of bypass openings 72 corresponds to the location of one of the intermediate manifold spaces 70B, 70C. Most of the bypass openings 72 at the intermediate manifold spaces are defined by aligned circular apertures 74, 76. However, some or all of the circular bypass openings 72 may be replaced by elongated transverse slots.

Where the channel elements 65 include one or more corrugated fin sheets 66, as in the present embodiment, heat exchanger 10 may include one or more positioning elements 78. The predominant function of positioning elements 78 is to ensure proper location of the corrugated fin sheets 66A, 66B, 66C within the return flow passage 20, and relative to the heat-generating substrates 2. These positioning elements 78 are further examples of channel elements 65, as described above. Each positioning element 78 extends into the return flow passage 20 at the upstream or downstream end 62, 64 of a cooling zone 60, to abut an upstream or downstream edge of a corrugated fin sheet 66. At least one positioning element 78 may be provided at each of the upstream and downstream ends 62, 64 of each cooling zone 60. In the illustrated embodiment, each positioning element 78 extends from the intermediate plate 16 (specifically the central portion 40 of second embossed plate 36) and comprises a local deformation, such as a rib or a dimple. The positioning elements 78 located at the intermediate manifold spaces 70B, 70C may be elongated in the longitudinal dimension (y-axis) to abut two adjacent corrugated fin sheets 66.

The positioning elements 78 may optionally include apertures 80. For example, in the present embodiment, the positioning elements 78 comprise longitudinally-extending ribs with the apertures 80 provided at their ends. In some embodiments, the apertures 80 of the positioning elements 78 may be aligned with apertures 74 or other openings in the first embossed plate 34 to provide additional bypass openings 72, as discussed below. Alternatively, some positioning elements 78 are not aligned with apertures 74 in the first embossed plate 34, and do not have a bypass function. For example, in the present embodiment, the positioning element 78 at the downstream end 64 of cooling zone 60C closest to outlet port 22 is not aligned with an aperture 74 in the first embossed plate 34, nor are the two positioning elements 78 at the upstream end 72 of cooling zone 60A.

As shown in FIGS. 4 and 7-9, the input flow passage 18 includes channel elements 65 in the form of one or more support elements 82. These support elements 82 comprise a plurality of elongate, longitudinally-extending ribs, labelled as 82A, 82B, 82C. Each support element 82 extends throughout the height (along z-axis) of the input flow passage 18 and contacts the intermediate plate wall 16 and the first outer plate wall 12. In heat exchanger 10, the predominant function of the support elements 82 is to provide structural support for the input flow passage 18. However, in embodiments where one or more heat-generating substrates 2 are provided along the external surface of the first outer plate wall 12, these support elements 82 may also enhance heat transfer from the heat-generating substrate(s) 2 to the heat transfer fluid flowing through the input flow passage 18. In such embodiments, the portions of the input flow passage 18 occupied by support elements 82 will define one or more additional cooling zones 60.

While each of the flow passages 18, 20 provides only one type of channel element 65 to enhance heat transfer, i.e. support elements 82 in the input flow passage 18 and corrugated fin sheets 66 in the return flow passage 20, this is not essential. Instead, either or both of the flow passages 18, 20 may include two or more different types of channel elements 65 to enhance heat transfer, depending on the cooling requirements of the heat-generating substrates 2 positioned along the first and second outer plate walls 12, 14. For example, it is possible to provide combinations of corrugated fin sheets 66 and support elements 82 in either or both of the flow passages 18, 20.

One or more of the support elements 82 may include apertures 84 to permit fluid to flow through the support element 82. For example, each support element 82 in the present embodiment has opposite ends which are longitudinally spaced apart (along y-axis), with apertures 84 being provided at the opposite ends. Therefore, some of the flow through the input flow passage 18 passes through each of the support elements 82, entering the aperture 84 proximate to the inlet port 22 and exiting the aperture 84 proximate to the manifold opening 30. Therefore, each support element 82 in the present embodiment defines an open-ended flow channel 86 which is located within the input flow passage 18.

In the laminated structure of the intermediate plate wall 16, the support elements 82 are formed in the flat central portion 38 of the first embossed plate 34. Therefore, as shown in FIG. 9, each intermediate plate wall 16 defines a plurality of enclosed flow channels 86. Each flow channel 86 has a top wall and sidewalls defined by one of the support elements 82 in the flat central portion 38 of the first embossed plate 34, and a bottom wall defined by the flat central portion 40 of the second embossed plate 36.

One or more of the bypass openings 72 may be provided inside the enclosed flow channels 86, such that a portion of the heat transfer fluid flowing through the relatively high pressure flow channel 86 flows into the relatively low pressure return flow passage 20. In the laminated intermediate plate wall 16 of the present embodiment, these bypass openings 72 comprise apertures 76 and/or 80 of the second embossed plate 36 aligned with the interior of an enclosed flow channel 86. This is shown in FIGS. 7-9. As with the bypass openings 72 described above, the location of each bypass opening 72 inside the enclosed flow channels 86 may correspond to the location of a manifold space 70, to provide further bypass flow from the input flow passage 18 to one or more of the manifold spaces 70. In the illustrated embodiment, each of the enclosed flow channels 86 includes two bypass openings 72 along its length, each comprising an aperture 76 or 80 located inside the flow channel 86 of a support element, and in direct communication with one of the intermediate manifold spaces 70B, 70C.

The presence of bypass openings 72 has an impact on the total pressure drop between the inlet port 22 and the outlet port 24. In this regard, there is a greater resistance of fluid flow through the return flow passage 20, as compared to the input flow passage 18, due to the presence of corrugated fin sheets 66 and/or other channel elements 65 in the cooling zones 60. The flow resistance caused by corrugated fin sheets 66 accounts for a large proportion of the total pressure drop between the inlet port 18 and the outlet port 20, in some cases greater than 50%. Therefore, allowing a portion of the heat transfer fluid to bypass one or more cooling zones 60 will bring about a reduction in total pressure drop through the heat exchanger 10, in comparison with an identical heat exchanger lacking bypass openings 72. The total pressure drop through the heat exchanger 10 is reduced as the amount of fluid flow through the bypass openings 72 increases. The reduction in total pressure drop can be significant, and allows one to increase the density/performance of the corrugated fin sheets 66 or other channel elements 65 in one or more cooling zones 60, to reduce the temperatures of the heat-generating substrates 2. For reasons of balancing pressure drop and/or temperature, it may be desirable to provide corrugated fin sheets 66 with different density and/or performance in different cooling zones 60. However, for reasons of manufacturability, it may be more desirable to provide identical corrugated fin sheets 66 in the different cooling zones 60.

Similarly, the provision of bypass openings 72 to allow fluid flow between the input flow passage 18 and the return flow passage 20 at one or more cooling zones 60 allows temperature balancing of the heat-generating substrates 2, as described below. In comparison to an identical heat exchanger lacking bypass openings 72, the cooling zone(s) 60 closest to the outlet port 24 are relatively cooler in the heat exchanger 10 of the present embodiment. By calibrating the amounts of fluid flowing through the various bypass openings 72, bypassing one or more cooling zones 36, it is possible to reduce the temperature differential between the heat-generating substrates 2 located in different areas of cooling plate 10. In the present embodiment, this means that the heat-generating substrate 2 on top of the cooling zone 60A closest to the inlet port 22 (along flow path 32) will be relatively hotter, and the heat-generating substrate 2 on top of the cooling zone 60C closest to the outlet port 24 will be relatively cooler, as compared to an equivalent heat exchanger lacking bypass openings 72. In theory, the presence or absence of bypass openings 72 does not affect the amount of energy placed into the coolant stream, and the coolant outlet temperature is substantially the same regardless of the presence or absence of bypass openings 72.

Therefore, by calibrating the volumes of heat transfer fluid flowing through the respective cooling zones 60 and bypass openings 72, it is possible to minimize the temperature differential between the heat-generating substrate 2 closest to the inlet port 22 and the heat-generating substrate 2 closest to the outlet port 24, thus improving performance of the heat exchanger 10 for a given pressure drop. This calibration is performed by controlling the number, area and locations of the bypass openings 72. In this regard, the drawings show that the row of bypass openings 72 providing bypass flow to the intermediate manifold space 70C upstream of the cooling zone 60C closest to the outlet port 24 have a somewhat smaller area than the bypass openings 72 providing bypass flow to the intermediate manifold space 70B. Such calibration may reduce bypass flow into the cooling zone 60C immediately adjacent to the outlet port 24, for example where cooling zone 60C has a lower thermal input than one or more of the other cooling zones 60A, 60B, and/or the heat-generating substrate 2 closest to the outlet port 24 is able to withstand a higher temperature than one or more of the other heat-generating substrates 2.

It is clear from the above discussion that the bypass openings 72 have an impact on fluid temperature and pressure drop. It can also be seen that calibrating the amount and location of bypass flow in heat exchanger 10 and/or adjusting the performance of channel elements 65 allows one to reduce the maximum temperature of the heat-generating substrates 2, and to reduce the temperature differentials between the heat-generating substrates 2 located on different areas of the heat exchanger 10.

In heat exchanger design, heat transfer performance is balanced with pressure drop. As a properly designed heat transfer surface becomes more effective, the pressure drop in the working fluid is increased. There is generally a preference to keep all cooling zones (and the corresponding heat-generating substrates) at or about the same temperature, for reasons of durability, uniformity of performance, etc. The embodiments described herein allow for the design of heat exchanger 10 to be tuned, giving the designer the ability to adjust the temperatures and flow rates in the cooling zones 60 to operate at or close to a uniform temperature by reducing the effective amount of heat transfer fluid flowing through cooling zones 60 which, in conventional cooling plates of this type, would be at a lower temperature. This reduction in flow through a specific cooling zone 60 is achieved by providing a low pressure drop bypass of some fluid through one or more bypass openings 72. This reduces the pressure drop for the specific cooling zone 60 and the overall pressure drop of the heat exchanger 10. Performance of the entire heat exchanger 10 can then be enhanced by changing the design of the channel elements 65, by increasing their heat transfer performance and their pressure drop. As a result, the performance of the heat exchanger 10 can be enhanced, while the total pressure drop remains about the same as that of a similar cooling plate without a calibrated bypass.

Figure 10:
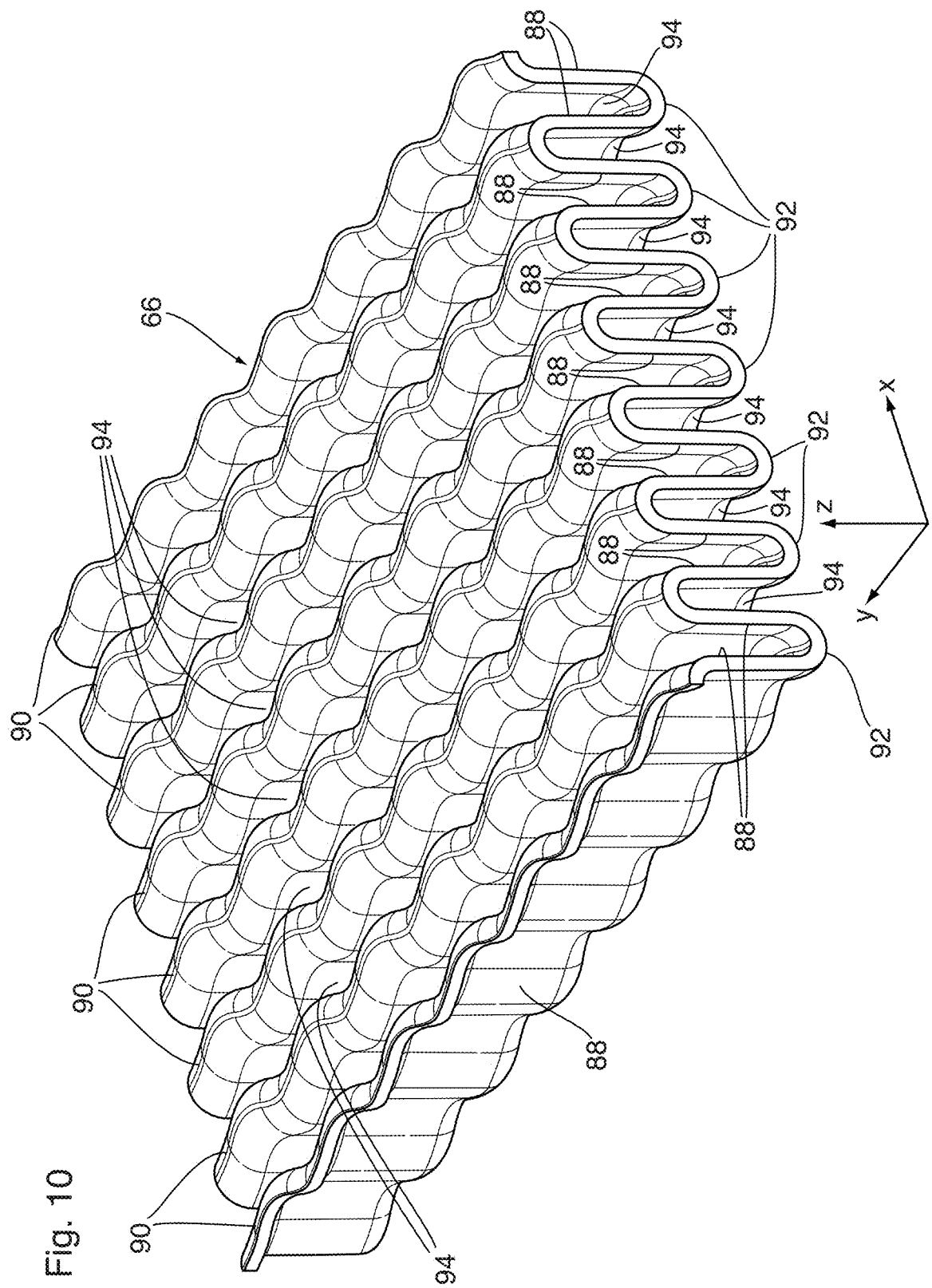
FIG. 10 is a perspective view of a corrugated fin sheet of the heat exchanger of FIG. 1.

An example of a corrugated fin sheet 66 is shown in isolation in FIG. 10. Each corrugated fin sheet 66 includes a plurality of corrugations comprising spaced sidewalls 88 extending lengthwise along the y-axis and having a height defined along the z-axis. Adjacent sidewalls 88 are joined by top and bottom walls 90, 92 adapted for direct contact with the intermediate plate wall 16 and one of the outer plate walls 12, 14, and which may be metallurgically bonded thereto. Between the sidewalls 88 are a plurality of fluid flow channels 94. The sides of fluid flow channels 94 are defined by the sidewalls 88, and the tops and bottoms of fluid flow channels 94 are defined by top and bottom walls 90, 92 of corrugated fin sheet 66, and the intermediate plate wall 16 or one of the outer plate walls 12, 14. The ends of the fluid flow channels 94 are open at the upstream and downstream ends 62, 64 of the cooling zones 60.

The corrugated fin sheets 66 shown in the drawings have a wavy shape in plan view to maximize heat transfer surface area and provide turbulent flow in the heat transfer fluid. However, this specific type of corrugated fin sheet 66 is not essential. In this regard, the sidewalls 88 may be flat, may be imperforate or provided with apertures or louvers, the sidewalls 88 may be interrupted by offset portions; and the top and bottom walls 90, 92 may be rounded or flat. For example, the corrugated fin sheets 66 may comprise offset or lanced strip fins, examples of which are described in U.S. Pat. No. Re. 35,890 (So) and U.S. Pat. No. 6,273,183 (So et al.). The patents to So and So et al. are incorporated herein by reference in their entireties. To simplify manufacturing, all the corrugated fin sheets 66 may be identical with regard to the arrangement, shape and spacing of the corrugations. In the above discussion of temperature balancing and pressure drop, it is mentioned that the density/performance of channel elements 65 may be increased. Where the channel elements 65 comprise corrugated fin sheets 66, performance may be increased by decreasing spacing between the sidewalls 88, thereby increasing the density of the fin sheet 66. Increasing the density of the fin sheet 66 also increases its pressure drop.

Figure 11:
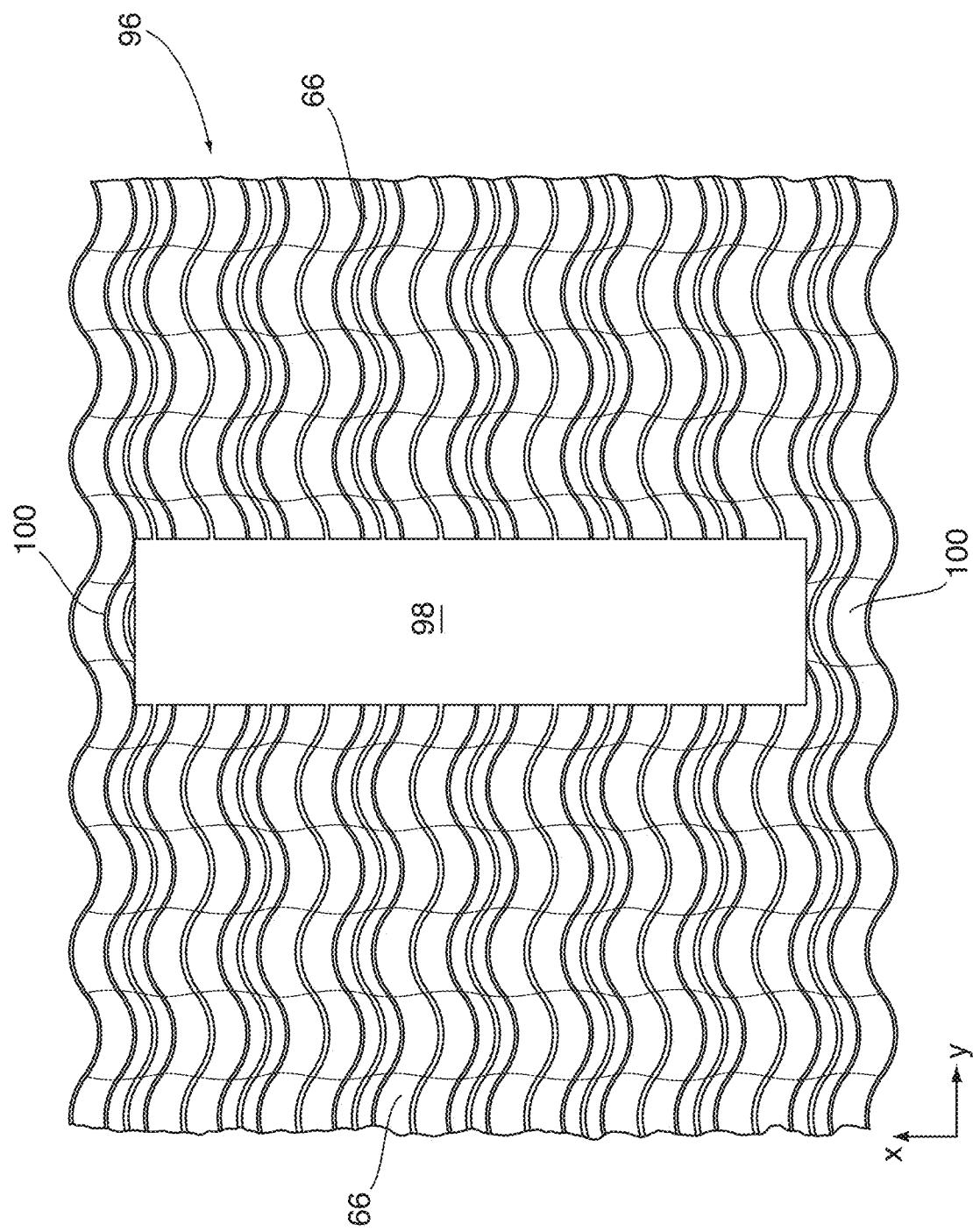
FIG. 11 is a plan view of a corrugated fin sheet according to an alternate embodiment.

Some embodiments do not require positioning elements 78, or may require fewer positioning elements 78. In such embodiments, correct positioning of the corrugated fin sheets 66 relative to each other and the heat-generating substrates 2 may be at least partly ensured by providing connections between the corrugated fin sheets 66. For example, as shown in FIG. 11, the corrugated fin sheets 66 may be formed from a larger (e.g. longer) fin sheet 96, with portions defining the intermediate manifold spaces 70B, 70C being removed by stamping or the like to provide cutouts 98. The cutouts 98 do not extend across the entire transverse width of the larger fin sheet 96, such that one or more narrow connecting portions 100 remain between the adjacent corrugated fin sheets 66. The illustrated example includes two connecting portions 100 between adjacent corrugated fin sheets 66, the connecting portions 100 being located along the opposite edges of the larger fin sheet 96. However, one or more connecting portions 100 may be located anywhere across the width of sheet 96.

Figure 12:
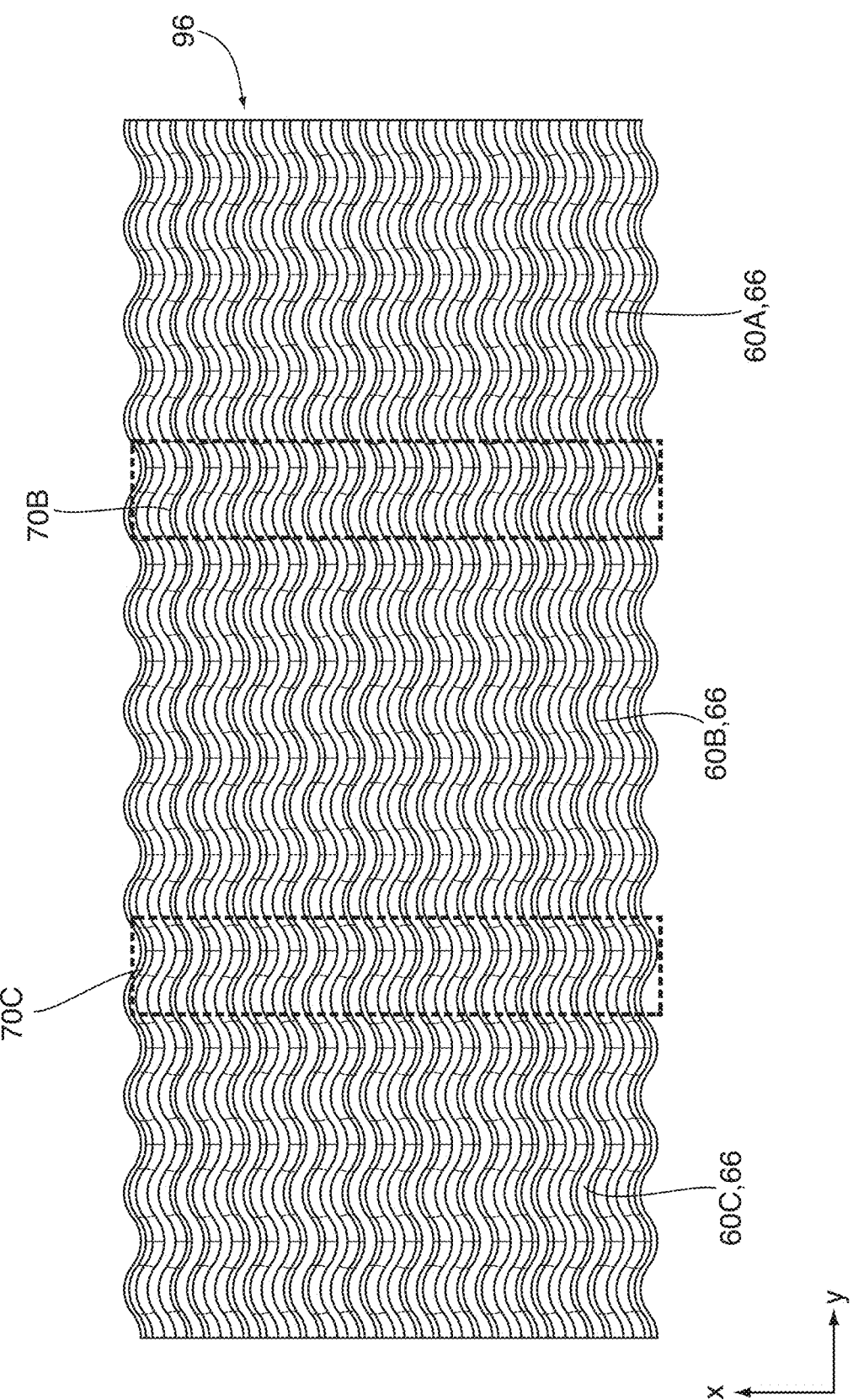
FIG. 12 is a plan view of a corrugated fin sheet according to another alternate embodiment.

Although the larger fin sheet 96 shown in FIG. 11 includes a cutout 98, this is not required in all embodiments. For example, as shown in FIG. 12, it is possible to completely eliminate one or more of the cutouts 98, and to provide a continuous fin sheet 96 which extends across two or more cooling zones 60, and across the manifold spaces 70 (shown in dotted lines) between them. In FIG. 12, the single fin sheet 96 has no cutouts 98, and extends continuously without interruption across all cooling zones 60A, 60B, 60C and the intermediate manifold spaces 70B, 70C. Such an embodiment completely eliminates the manufacturing step(s) involved in forming the cutouts 98.

By allowing the corrugations of a fin sheet 96 to extend across a manifold space 70, any bypass openings 72 provided in this manifold space 70 will only be in direct fluid communication with those fluid flow channels 94 of fin sheet which are in direct flow communication with the bypass opening 72, i.e. having a top or bottom wall 90, 92 in which the bypass opening 72 is defined. Such a bypass opening 72 will produce less bypass flow than an identical bypass opening 72 communicating with an open manifold space 70, however, this may be at least partially compensated by increasing the number and/or area of the bypass openings 72 in a given manifold space 70. Alternatively, the continuous fin sheet 96 may be provided with apertures or louvers in its sidewalls 88, or the sidewalls 88 may be interrupted by offset portions, as mentioned above, in which case there will be some transverse distribution (along x-axis) of the bypass flow beyond the fluid flow channels 94 in direct flow communication with the bypass opening 72. The provision of a continuous fin sheet 96 as shown in FIG. 12 may be advantageous in some embodiments, as it may simplify manufacturing and reduce cost.

Similarly, rather than locating bypass openings 72 only at the manifold spaces 70, it is possible to locate one or more bypass openings 72 within any one or more of the cooling zones 60 having a corrugated fin sheet 66. As noted above, such a bypass opening 72 will produce less bypass flow than one located at a manifold space 70, since the opening 72 will be partly obstructed by the fin sheet 66. However, placement of bypass openings 72 within the cooling zones 60 may be used for targeted delivery of heat transfer fluid to localized hot spots within the cooling zone 60. For example, FIGS. 4 and 5 shows how a further bypass opening 72' may be located in an area corresponding to cooling zone 60C of FIG. 6, the further bypass opening 72' comprising aligned openings 74' and 76' (shown in dotted lines) in the first and second embossed plates 34, 36. The incorporation of a further bypass opening 72' within a cooling zone 60 permits targeted delivery of small amounts of cold heat transfer fluid to areas of the cooling zone 60 which underlie localized "hot spots" of one of the heat-generating substrates 2.

Figure 13:
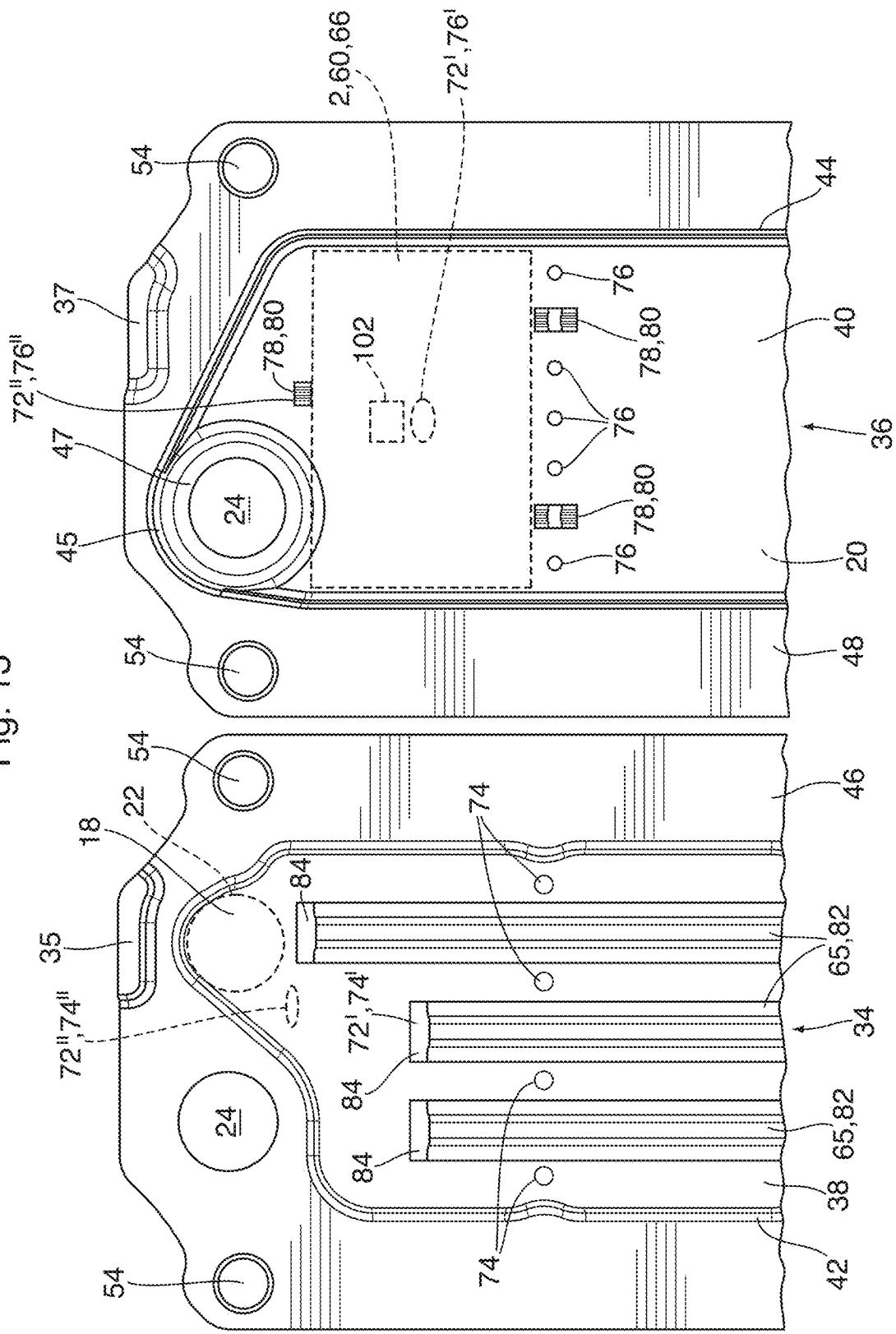
FIG. 13 is a plan view showing portions of modified first and second embossed plates.

FIG. 13 further illustrates the use of bypass openings to provide customized cooling of hot spots, and to control the overall pressure drop of heat exchangers according to the present description. In this regard, FIG. 13 illustrates portions of first and second embossed plates 34, 36, substantially identical to those shown in FIGS. 4 and 5, except as noted below.

In FIG. 13 dotted lines are used to show the approximate outlines of a heat-generating substrate 2, a cooling zone 60, and a corrugated fin sheet 66 closest to the outlet port 24. The location of a hot spot 102 of the heat-generating substrate 2 is also indicated by dotted lines in FIG. 13, with the hot spot 102 representing a localized area of relatively high heat generation. This area may correspond to the location of a heat-generating component including one or more computer chips.

Located immediately upstream of the hot spot 102 and within the cooling zone 60 is an opening 76' through plate 36. When the first embossed plate 34 is stacked on top of the second embossed plate 36 to form the intermediate plate wall 16, the opening 76' of plate 36 aligns with the underside of the middle support element 82 of the first embossed plate 34, and with the aperture 84 at the end of the support element 82. This area is labelled as opening 74' in FIG. 13. Therefore, when the two embossed plates 36 are stacked, the openings 74' and 76' align to form a bypass opening 72' which permits delivery of cool heat transfer fluid from the input flow passage 18 to the cooling zone 60, immediately upstream of the hot spot 102. The openings 72', 76' are of sufficient width to deliver cooling fluid across the entire width of the hot spot 102, with the opening 76' having a transversely elongated oval shape for this purpose.

In addition to having a bypass opening 72' within the cooling zone 60, the embossed plates 34, 36 of FIG. 13 includes openings 74" and 76" which align to form a bypass opening 72". The primary or sole purpose of bypass opening 72" is to control or reduce the total pressure drop of the heat exchanger in which the plates 34, 36 are incorporated.

In this regard, the first embossed plate 34 includes an opening 72" located proximate to the inlet and outlet ports 22, 24, the location of the inlet port being shown in dotted lines. The second embossed plate 36 includes an opening 76" which is similarly located proximate to the inlet and outlet ports 22, 24. The opening 76" is provided by an aperture 80 of a positioning element 78 located at the downstream end of the cooling zone 60. However, this is not necessary, and the opening 76" may simply comprise an aperture through the second embossed plate 36, similar to opening 74".

The openings 74" and 76" of plates 34, 36 align to form a bypass opening 72". This bypass opening 72" is located proximate to the inlet and outlet ports 72", and is outside of any cooling zones 60. The bypass opening 72" therefore provides a direct conduit for heat transfer fluid to flow from the input flow passage 18 to the return flow passage 20, without passing through any of the cooling zones 60. Because the fluid flowing through bypass opening 72" essentially passes directly from the inlet port 22 to the outlet port 24, it will absorb little or no heat from any of the heat-generating substrates 2. However, by reducing the amount of fluid flowing through the heat exchanger, the presence of bypass opening 72" will reduce the overall pressure drop of the heat exchanger, i.e. the pressure drop between the inlet and outlet ports 22, 24. In some embodiments, no bypass opening 72" will be required. However, the inclusion of bypass opening 72" can be useful when balancing the thermal performance and pressure drop of the heat exchanger. Furthermore, the degree of pressure drop reduction can be controlled by varying the size of bypass opening 72″, wherein increasing the size of the bypass opening 72″ will increase the bypass flow and reduce the overall pressure drop.

Figure 14:
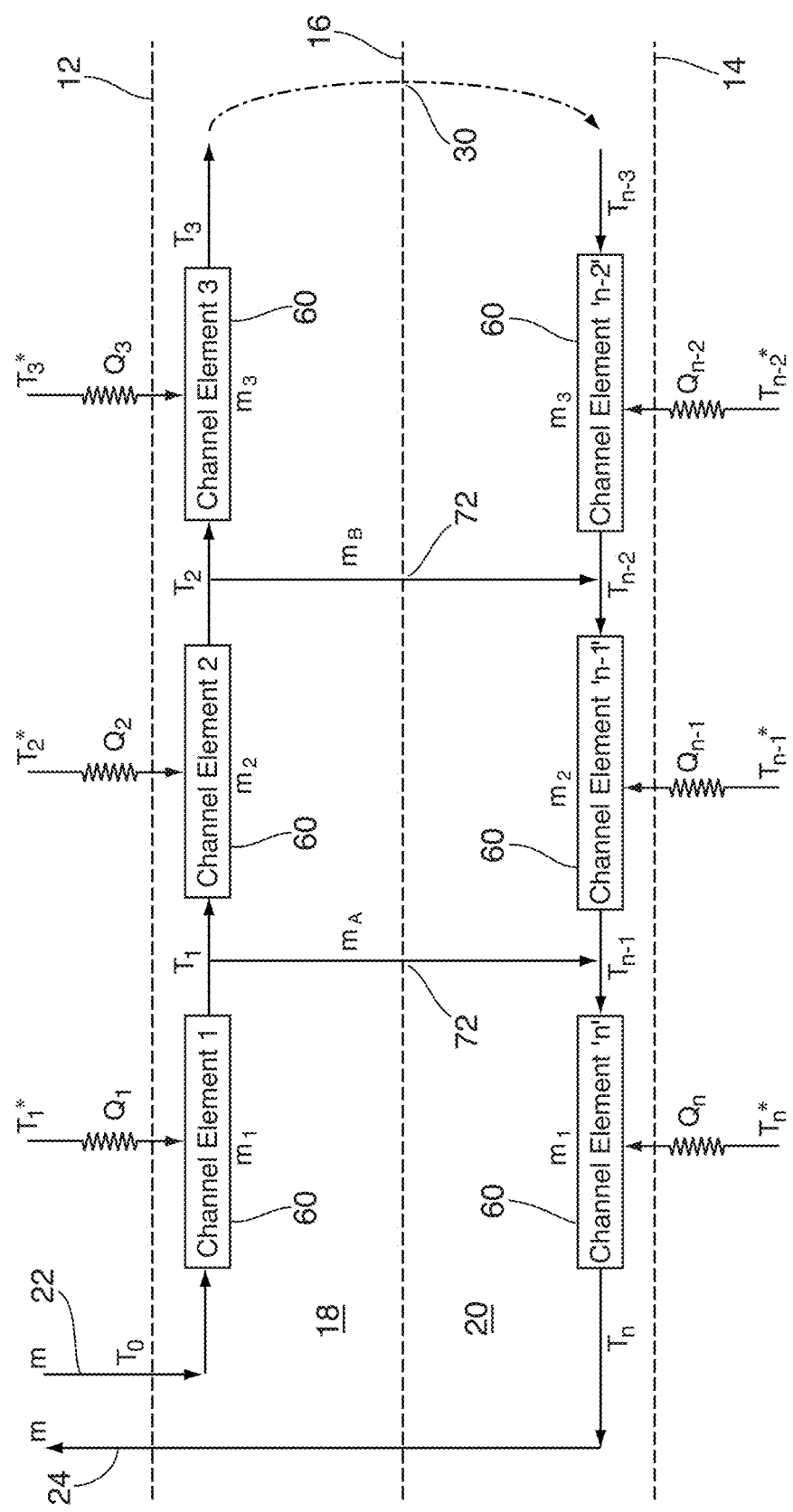
FIG. 14 is a schematic drawing illustrating the fluid routing through a heat exchanger as disclosed herein.

FIG. 14 and the discussion below demonstrate how a heat exchanger as described herein can be used to achieve temperature balancing of a number of heat-generating substrates. FIG. 14 is a flow diagram showing the fluid routing through a heat exchanger as described herein, and showing the locations of the first and second outer plate walls 12, 14, intermediate plate wall 16, input flow passage 18, return flow passage 20, inlet port 22, outlet port 24, manifold opening 30, cooling zones 60 and bypass openings 72. The heat exchanger of FIG. 14 has "n" cooling zones defined by "n" channel elements in FIG. 14, each channel element indicated by a rectangular box. It will be appreciated that the channel elements may be any of the channel elements 65 described herein.

Associated with each cooling zone/channel element is a heat-generating substrate, i.e. "n" heat-generating substrates in total. The heat-generating substrates are not explicitly shown in FIG. 14, however, the temperature "T*" of each of the "n" heat-generating substrates is shown in FIG. 14, as is the heat load "Q" added by each of the heat-generating substrates.

The letter "m" is used to denote the flow rate of fluid through the heat exchanger, and the letter "T" (without an asterisk) is used to denote fluid temperature within the heat exchanger. In addition, the zigzag arrows in FIG. 14 represent the thermal resistance between a heat-generating substrate and the heat transfer fluid inside the heat exchanger.

It can be seen that the fluid flow rate is "m" at both the inlet and outlet ports 22, 24, i.e. the amounts of fluid entering and leaving the heat exchanger are the same. The fluid temperature at the inlet port 22 is $T_0$, and is $T_n$ at the outlet, wherein $T_n > T_0$.

The fluid flow rate through bypass openings 72 is indicated by $m_A$ and $m_B$. The bypass openings 72 divert a portion of the fluid flow, and therefore the fluid flow rates through each of the channel elements can be calculated as follows:

$$m_1 = m$$

$$m_2 = m_1 - m_A$$

$$m_3 = m_2 - m_B$$

The temperature of the heat transfer fluid within the heat exchanger can be calculated as follows, wherein Cp is the specific heat of the heat transfer fluid:

$$T_1 = T_0 + Q_1/(m_1 \, Cp)$$

$$T_2 = T_1 + Q_2/(m_2 \, Cp)$$

$$T_3 = T_2 + Q_3/(m_3 \, Cp)$$

$$T_n = T_{n-1} + Q_n/(m_1 \, Cp)$$

$$T_{n-1} = \{[T_{n-2} + Q_{n-1}/(m_2 \, Cp)][m_2] + m_A \, T_1\}/m_1$$

$$T_{n-2} = \{[T_{n-3} + Q_{n-2}/(m_3 \, Cp)][m_3] + m_B \, T_2\}/m_2$$

For example, the constant Cp for water is about 4200 J/kg/K, and for 50/50 glycol/water it is about 3600 J/kg/K.

The temperatures of the heat-generating substrates heat transfer fluid within the heat exchanger can be calculated as follows:

$$T_n^* = Q_n \times \text{function of thermal resistance}(1/K, L, 1/A, 1/h, 1/A_{surf} \text{ etc.}) + (T_n + T_{n-1})/2$$

The variables $m_A$ and $m_B$ can then be optimized to minimize the differences in temperature $T_n^*$ of the heat-generating substrates. As mentioned above, the diversion of fluid through bypass openings 72 also reduces the overall pressure drop of the heat exchanger.

Although certain embodiments are described in the present disclosure, it is not restricted thereto. Rather, the disclosure includes all embodiments which may fall within the scope of the following claims.

What is claimed is:

1. A heat exchanger having a first end and a second end spaced apart along a longitudinal axis, the heat exchanger comprising:
    a first outer plate wall;
    a second outer plate wall;
    an intermediate plate wall located between the first and second outer plate walls and spaced therefrom along a thickness dimension of the heat exchanger;
    a first fluid flow passage for flow of a heat transfer fluid between the first outer plate wall and the intermediate plate wall;
    a second fluid flow passage for flow of a heat transfer fluid between the second outer plate wall and the intermediate plate wall, wherein the first and second fluid flow passages are arranged in stacked relation to one another along the thickness dimension;
    an inlet port configured for inputting the heat transfer fluid into the first fluid flow passage;
    an outlet port configured for discharging the heat transfer fluid from the second fluid flow passage, wherein the inlet and outlet ports are both located proximate to the first end of the heat exchanger;
    one or more manifold openings proximate to the second end of the heat exchanger, wherein the one or more manifold openings are configured to permit the heat transfer fluid to flow between the first and second fluid flow passages proximate to the second end;
    a plurality of cooling zones provided in the second fluid flow passage between the one or more manifold openings and the outlet port, wherein each said cooling zone is configured to receive heat transferred through the second outer plate wall from a heat-generating substrate located outside the heat exchanger, and wherein each of the cooling zones has an upstream end adapted for receiving heat transfer fluid flowing along the fluid flow path, and an opposite downstream end adapted for discharging the heat transfer fluid along the fluid flow path;
    a plurality of manifold spaces, including at least one intermediate manifold space defined as a gap between two said cooling zones which are immediately adjacent to one another; and
    at least one bypass opening extending through the intermediate plate wall between the first fluid flow passage and one of the at least one intermediate manifold spaces, and configured to permit a portion of the heat transfer fluid to bypass portions of the first and second fluid flow passages.

2. The heat exchanger of claim 1, wherein each of the cooling zones corresponds at least approximately in shape and area to one of said heat-generating substrates.

3. The heat exchanger of claim 1, wherein each of the cooling zones includes one or more channel elements configured to provide a conduit for heat transfer from the second outer plate wall to the heat transfer fluid, create turbulence in the heat transfer fluid, and/or to provide structural support for the second fluid flow passage.

4. The heat exchanger of claim 3, wherein the one or more channel elements in at least one of the cooling zones comprises a corrugated fin sheet which is in contact with the intermediate plate wall and the second outer plate wall.

5. The heat exchanger of claim 3, wherein the one or more channel elements in at least one of the cooling zones comprises one or more protrusions, each said protrusion comprising a rib or dimple extending into the second fluid flow passage from the intermediate plate wall or the second outer plate wall.

6. The heat exchanger of claim 1, comprising a plurality of said intermediate manifold spaces, and having at least one of said bypass openings located at each of the intermediate manifold spaces.

7. The heat exchanger of claim 1, wherein one or more of said bypass openings is located within one of said cooling zones.

8. The heat exchanger of claim 7, wherein said one or more bypass openings in said cooling zone is partly obstructed by a channel element in the cooling zone, wherein the channel element comprises a corrugated fin sheet.

9. The heat exchanger of claim 1, wherein one or more of said bypass openings is located proximate to the inlet port and the outlet port to permit a direct conduit for fluid flow from the first fluid flow passage to the second fluid flow passage, without passing through any of the cooling zones.

10. The heat exchanger of claim 1, wherein the first fluid flow passage includes one or more channel elements, each comprising a support element in contact with the intermediate plate wall and the first outer plate wall;
wherein each said support element has opposite ends which are spaced apart along the longitudinal axis.

11. The heat exchanger of claim 10, further comprising apertures at the opposite ends of at least one of said support elements, such that the support element defines an open-ended flow channel in the first fluid flow passage.

12. The heat exchanger of claim 11, wherein one or more of said bypass openings is provided inside one of said open-ended flow channels, such that a portion of the heat transfer fluid flowing through the open-ended flow channel is diverted to the second fluid flow passage.

13. The heat exchanger of claim 1, wherein the intermediate plate wall is a composite wall structure comprising substantially flat central portions of first and second embossed plates which are laminated together face-to-face.

14. The heat exchanger of claim 13, wherein the flat central portion of each of the first and second embossed plates is surrounded by an upstanding sidewall which terminates in an outwardly extending, planar, peripheral sealing flange which is sealed to an internal surface of one of the outer plate walls along an outer perimeter of the embossed plate.

15. The heat exchanger of claim 14, wherein said at least one bypass opening comprises aligned apertures in the flat central portions of the first and second embossed plates.

16. The heat exchanger of claim 14, wherein the first and second outer plate walls comprise substantially flat plates which are parallel and spaced apart along the thickness dimension of the heat exchanger;
wherein the first and second outer plate walls are thicker than the first and second embossed plates; and
wherein the second outer plate wall has an external surface which is sufficiently flat to maintain intimate contact with a flat surface of the heat-generating substrate.

17. The heat exchanger of claim 16, wherein the inlet and outlet ports are both provided in the first outer plate wall.

18. The heat exchanger of claim 1, wherein the plurality of cooling zones in the second fluid flow passage are the only cooling zones of the heat exchanger.

* * * * *